United States Patent [19]
Mattos et al.

[11] Patent Number: 5,534,791
[45] Date of Patent: Jul. 9, 1996

[54] NOISE ISOLATED I/O BUFFER

[75] Inventors: Derwin W. Mattos, Sunnyvale; James D. Shiffer, II; Jeffrey F. Wong, both of Fremont, all of Calif.

[73] Assignee: VLSI Technology, Inc., San Jose, Calif.

[21] Appl. No.: 375,741

[22] Filed: Jan. 20, 1995

Related U.S. Application Data

[63] Continuation-in-part of Ser. No. 52,442, Apr. 23, 1993, Pat. No. 5,426,376.

[51] Int. Cl.$^6$ ............................................. H03K 19/0948
[52] U.S. Cl. ................... 326/27; 326/58; 326/87
[58] Field of Search ................... 326/26, 27, 57, 326/58, 83, 86, 87; 327/379, 380, 384, 387

[56] References Cited

U.S. PATENT DOCUMENTS

| | | | |
|---|---|---|---|
| 4,731,553 | 3/1988 | Van Lehn et al. | 326/27 |
| 4,806,794 | 2/1989 | Walters, Jr. | 326/30 |
| 4,928,023 | 5/1990 | Marshall | 326/27 |
| 4,975,598 | 12/1990 | Borkar | 326/83 |
| 5,296,757 | 3/1994 | Koizumi | 326/21 |
| 5,319,260 | 6/1994 | Wanlass | 326/26 |
| 5,332,932 | 7/1994 | Runaldue | 326/82 |
| 5,493,232 | 2/1996 | Kube | 326/27 |

*Primary Examiner*—Edward P. Westin
*Assistant Examiner*—Benjamin D. Driscoll
*Attorney, Agent, or Firm*—Burns, Doane, Swecker & Mathis

[57] ABSTRACT

An I/O buffer is provided that is noise-isolated, i.e., less susceptible to the effect of switching noise. In particular, a noise isolated I/O buffer includes an output terminal, a transient switching circuit connected to first power and ground voltage sources, to a logic input signal and to the output terminal, and a logic holding circuit connected to second power and ground voltage sources separate from the first power ground voltage sources, to the logic input signal and to the output terminal. The transient switching circuit causes a logic level of the output terminal to be switched responsive to a change in the input signal. The logic holding circuit causes the logic level of the output terminal to be maintained in the absence of a change in the input signal. In the absence of a change in the input signal, the transient switching circuit may be turned off, therefore presenting a high impedance to the first power and ground voltage sources. Switching noise in the first power supply network therefore is not transmitted through to the outputs of unswitched I/O buffers. The transient switching circuit and the logic holding circuit may be connected to the same power and ground voltage sources. The transient switching circuit, however, is turned off in the absence of a change in the input signal, and the logic holding circuit is turned off responsive to a change in the input signal. Smaller current surges are therefore provided at different times rather than a single large current surge, thereby reducing dI/dt. Provision is made for delaying turn on of the logic holding circuit until a logic transition of the output signal is substantially complete, further reducing the effects of switching noise on unswitched outputs. Preferably, the logic holding circuit, once it has been turned on, remains on despite possible changes in the output voltage level and is turned off only in response to changes in the input signal. The transient switching circuit may be constructed so as to, once it has been turned off, remain off despite possible changes in the output voltage level, or to turn back on in order to help return to output voltage to the proper level.

8 Claims, 16 Drawing Sheets

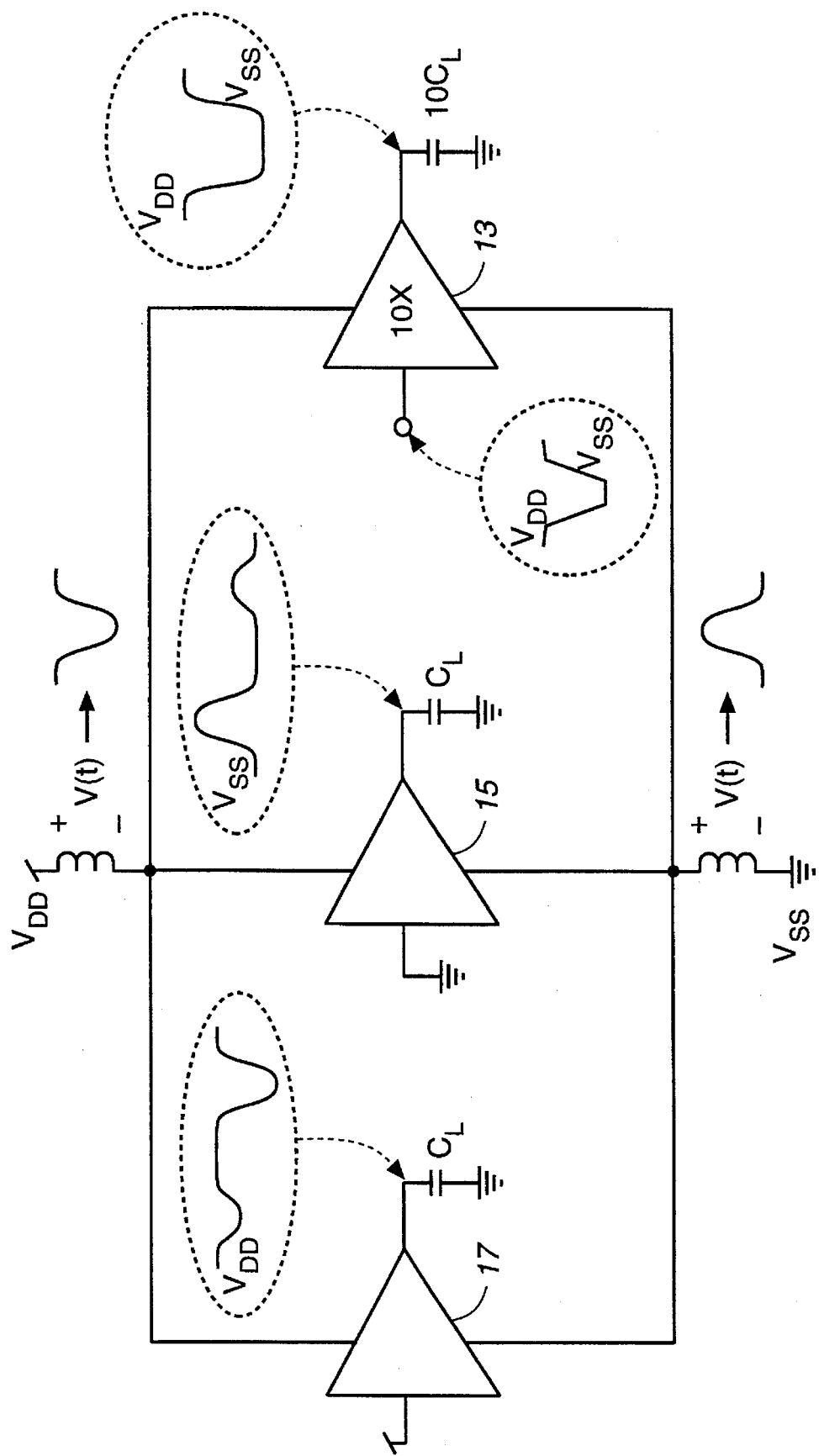
FIG._1

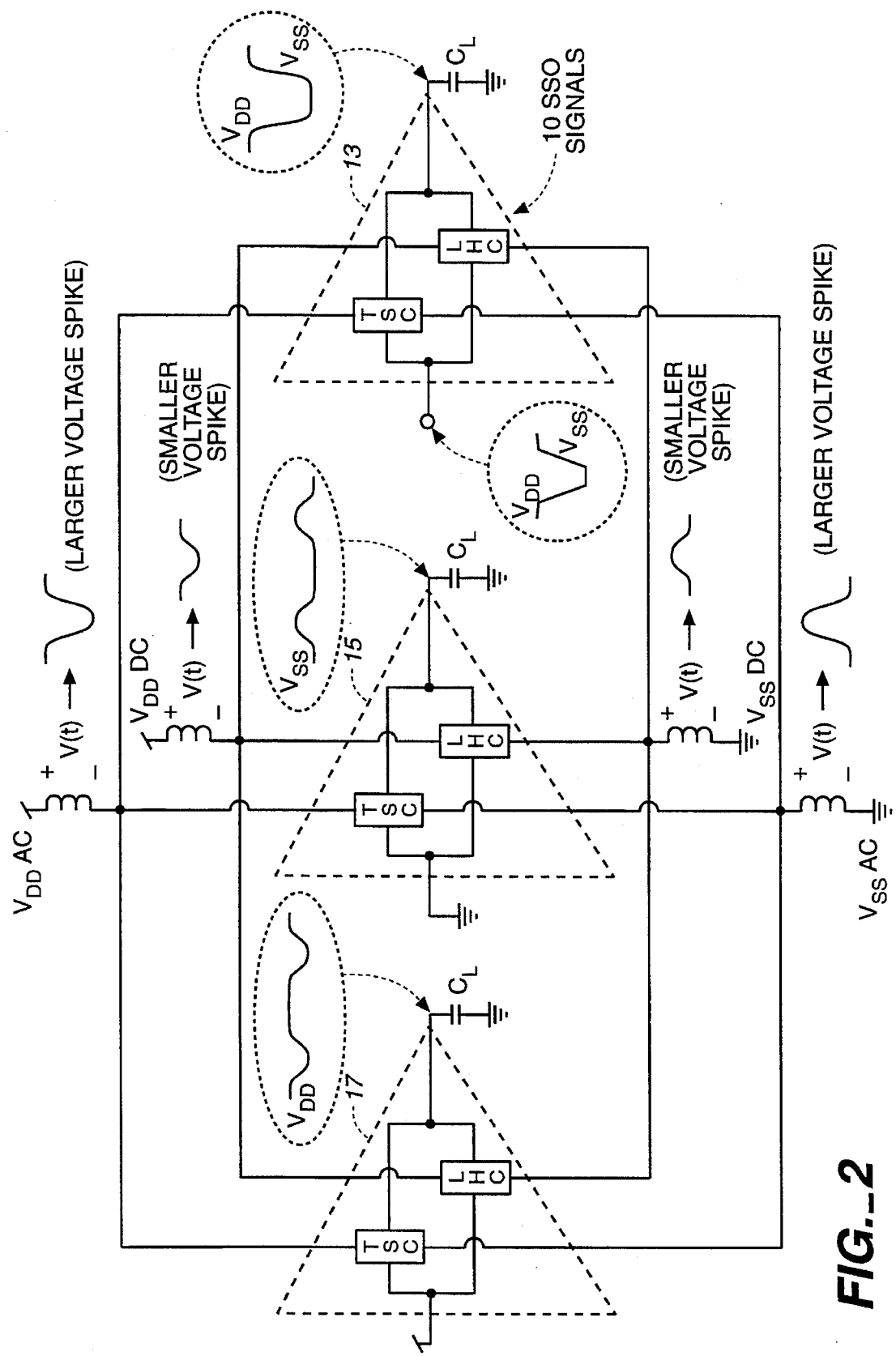
FIG._2

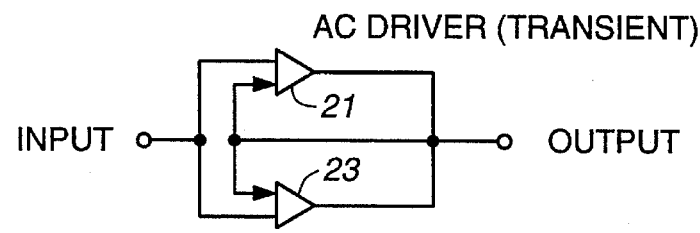
FIG._3
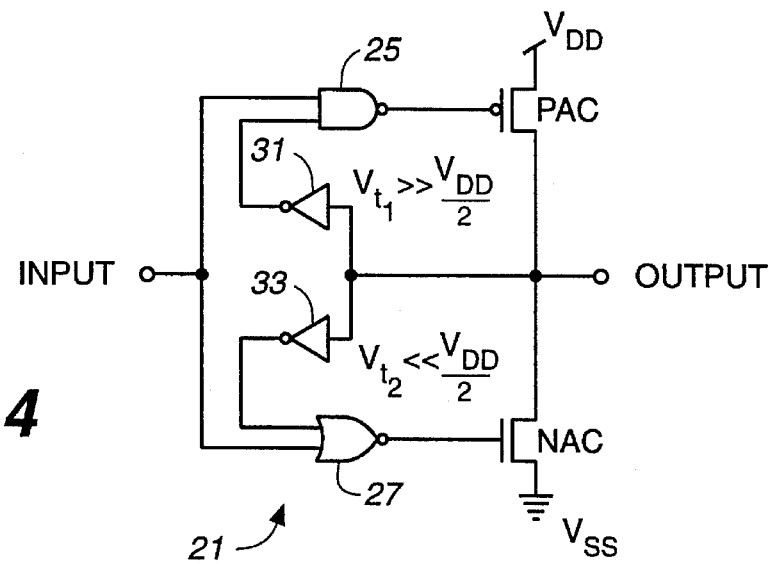
FIG._4
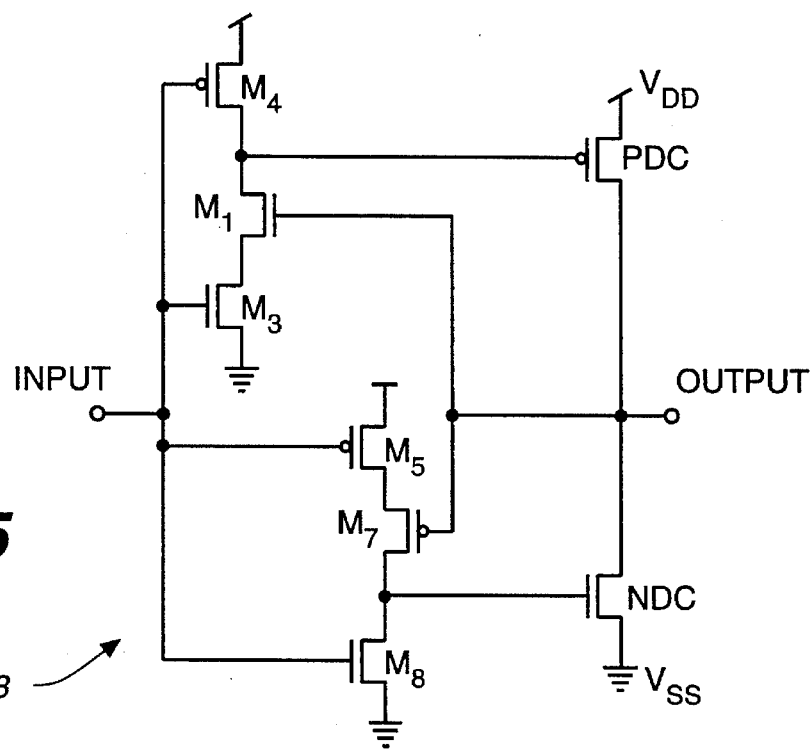
FIG._5

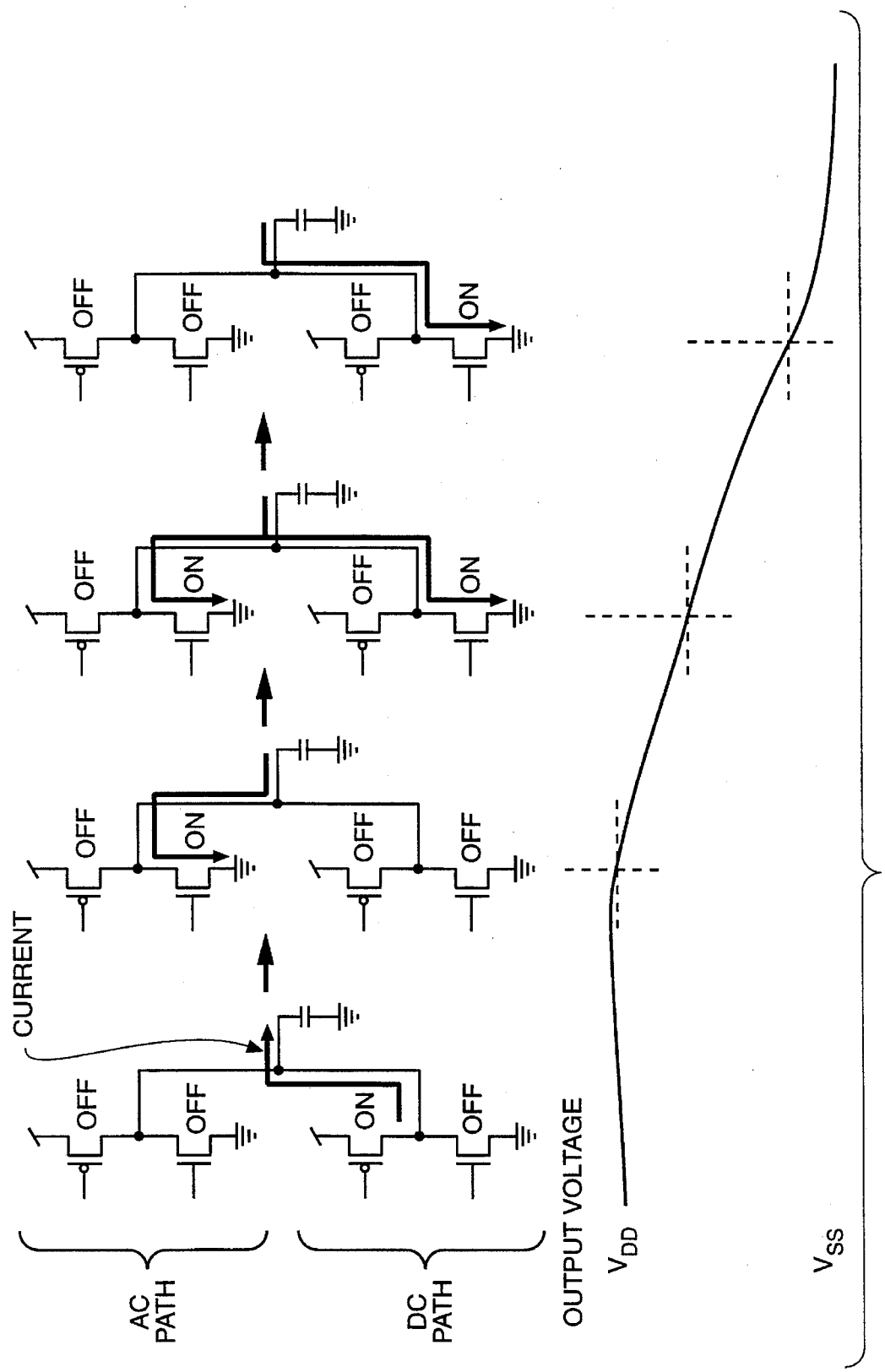
FIG._6

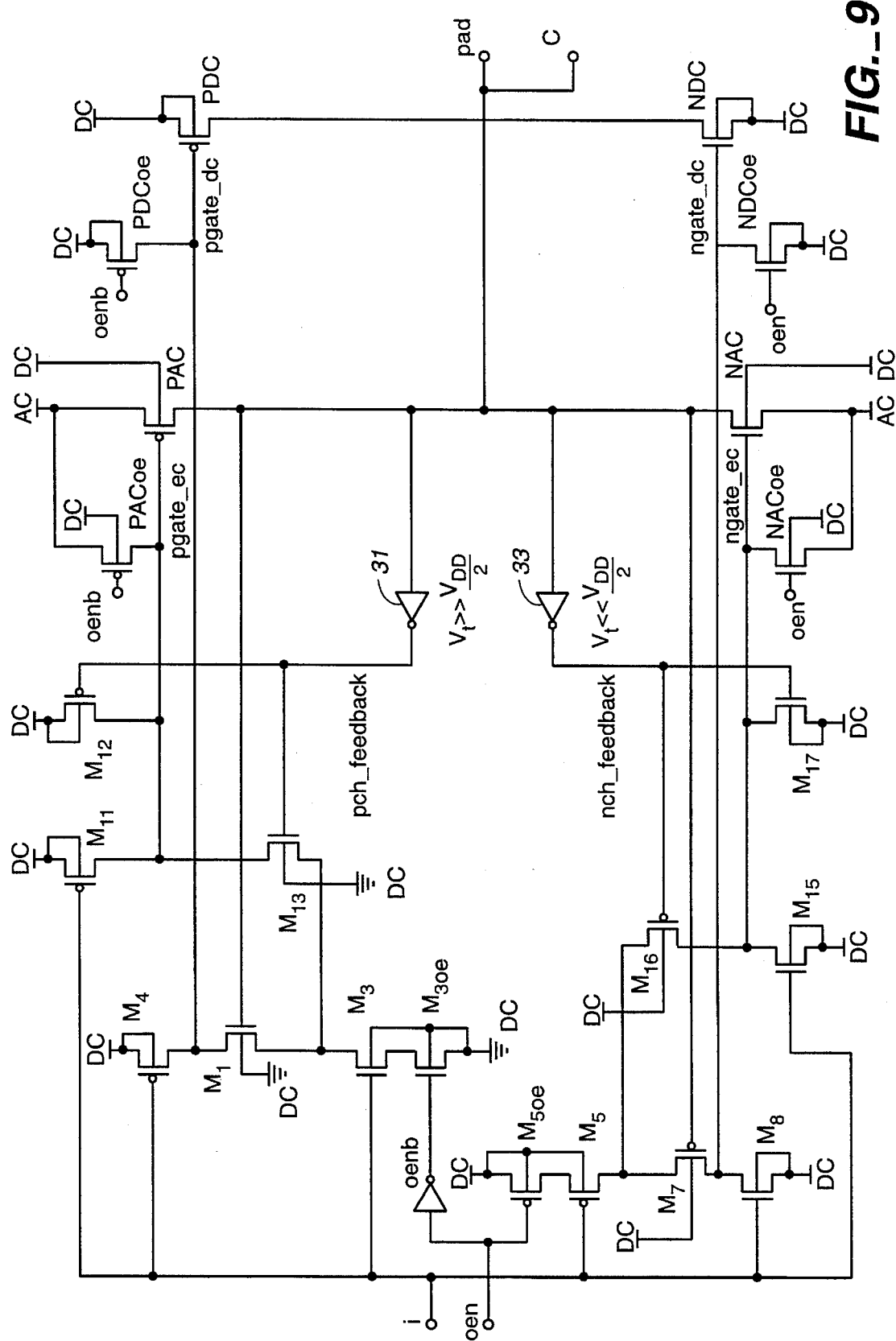
FIG._9

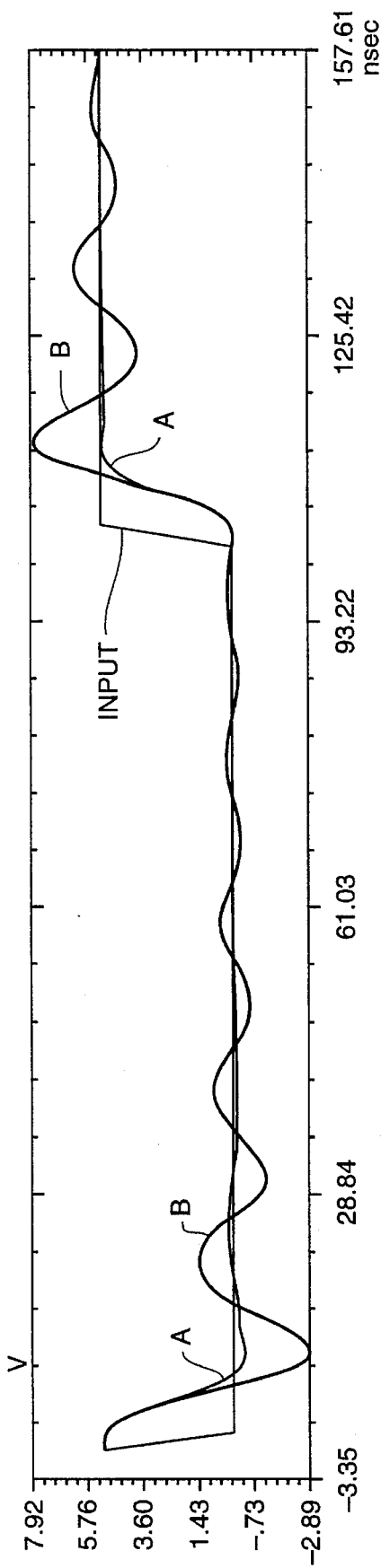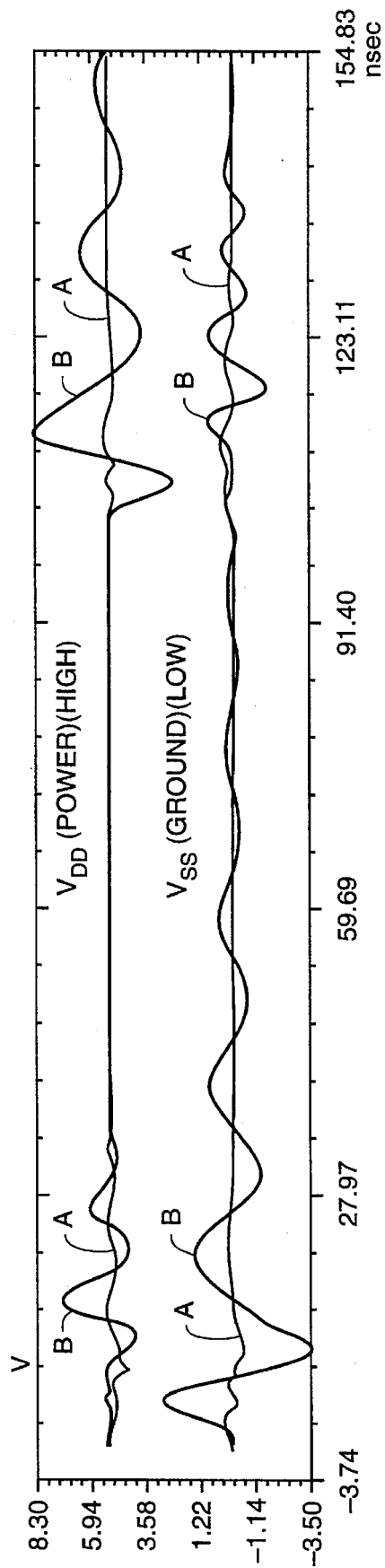

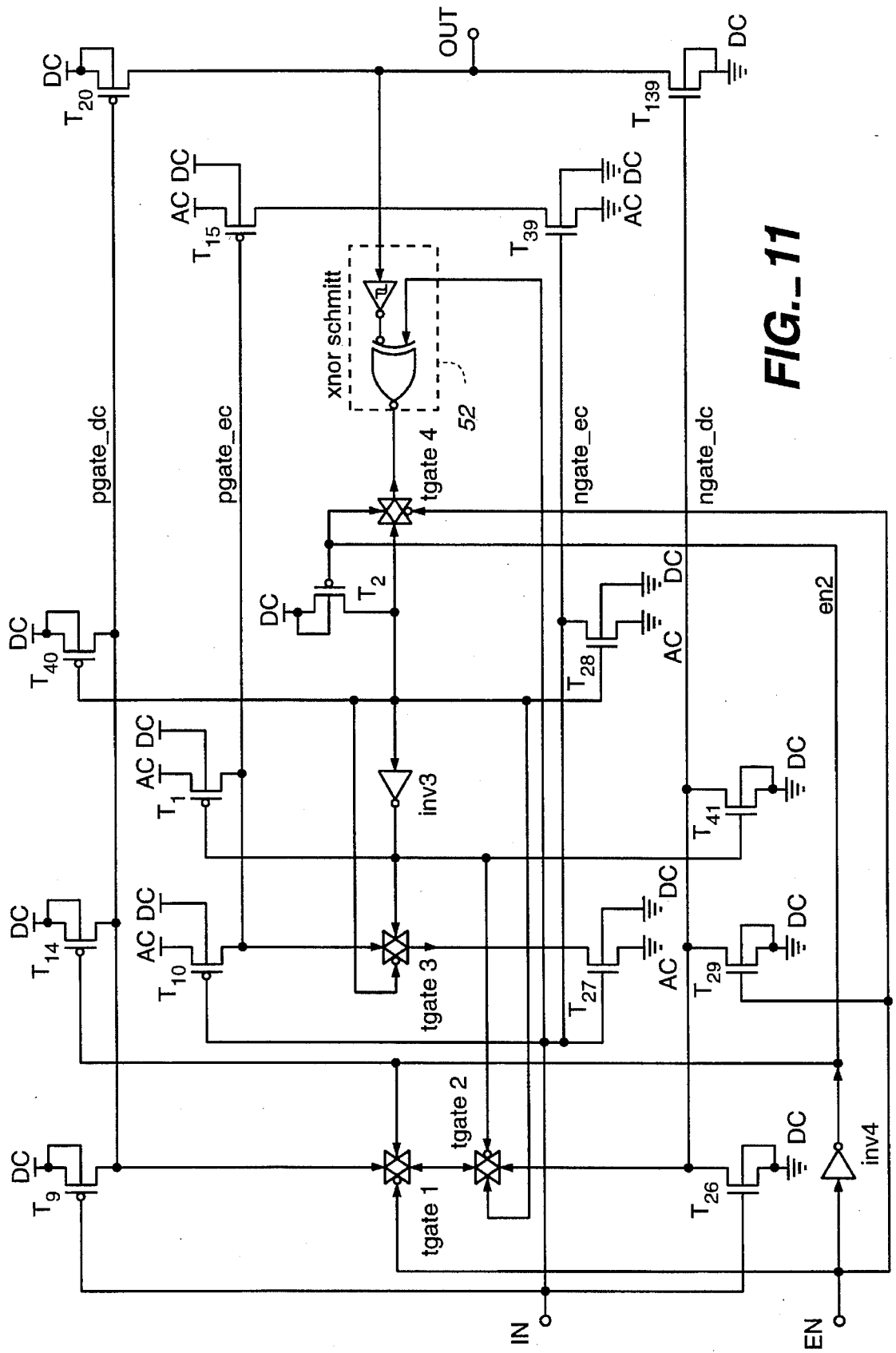
FIG._11

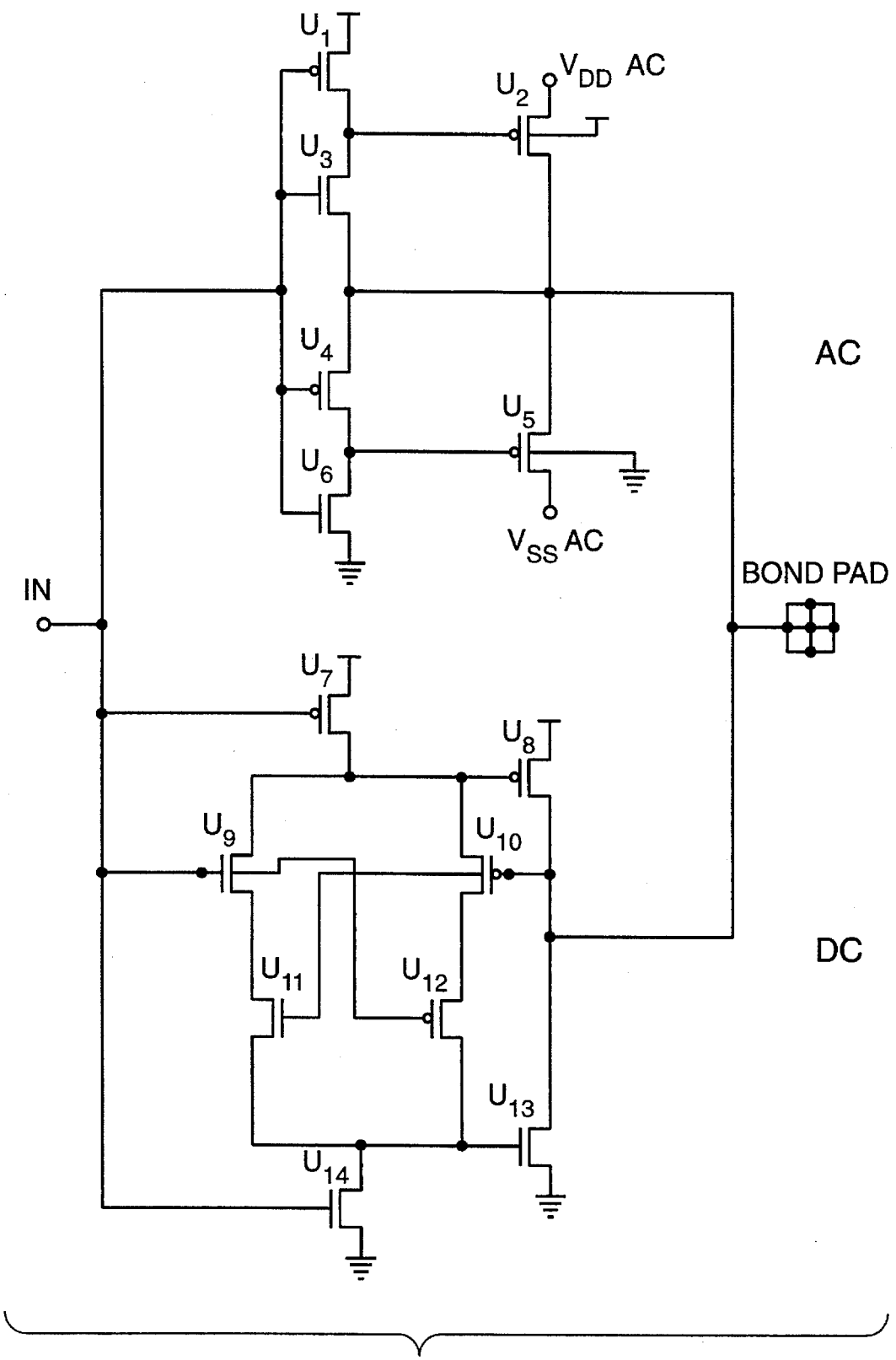
FIG._12

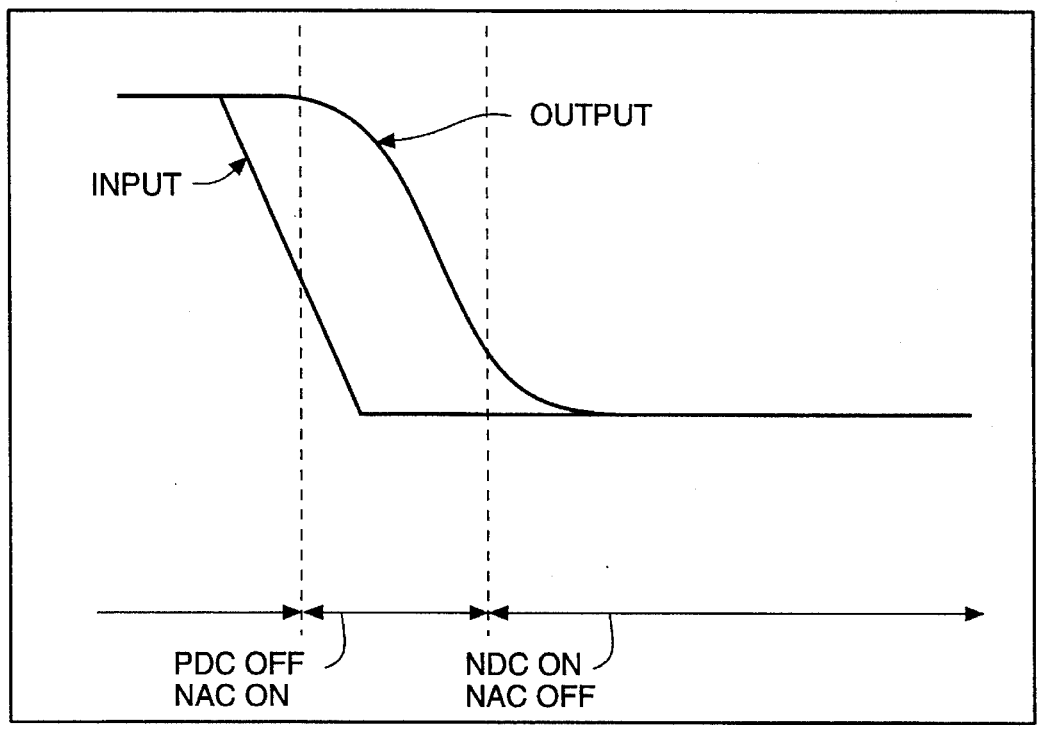
FIG._13
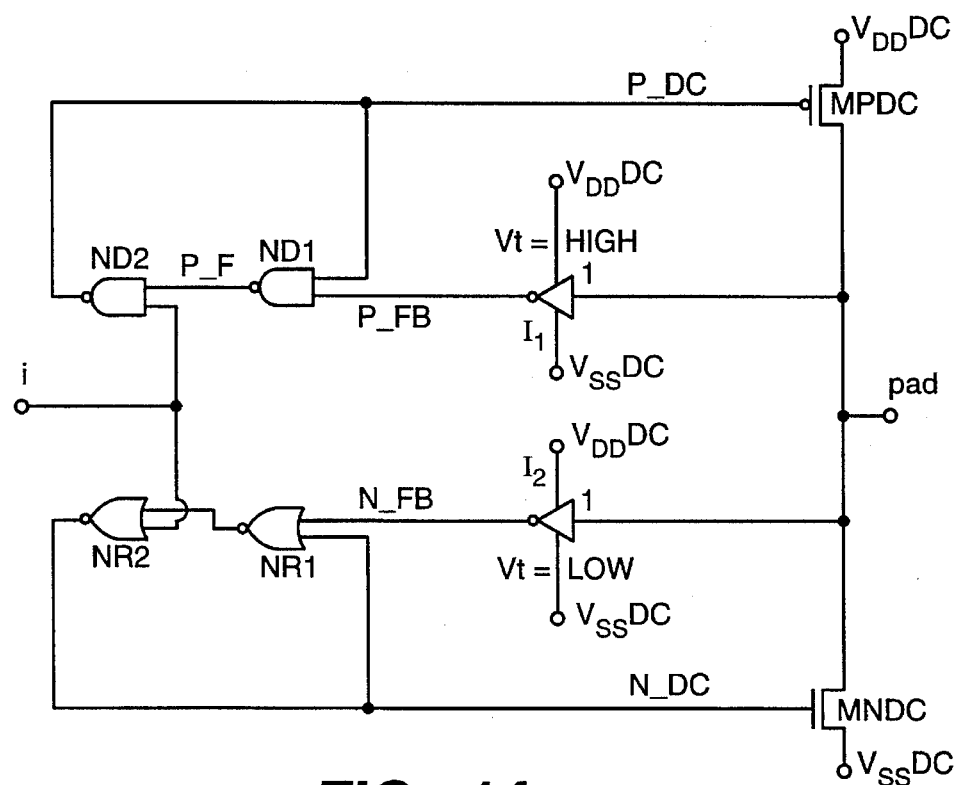
FIG._14

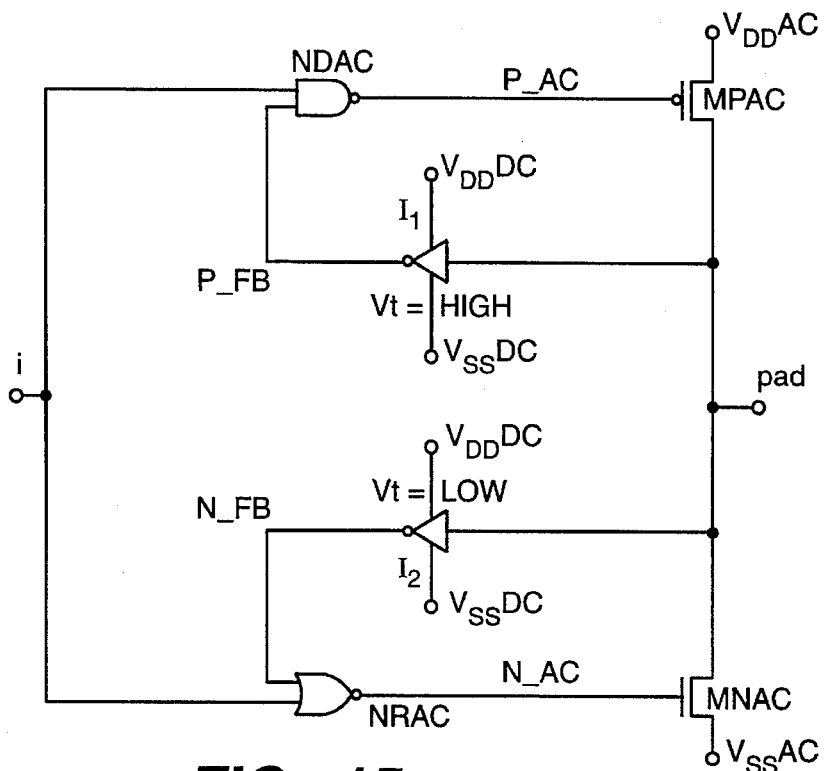
FIG._15
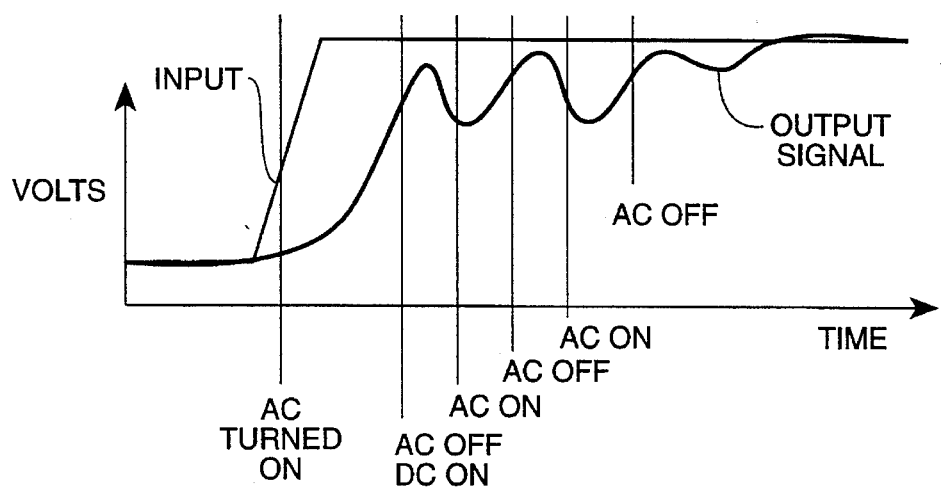
FIG._16

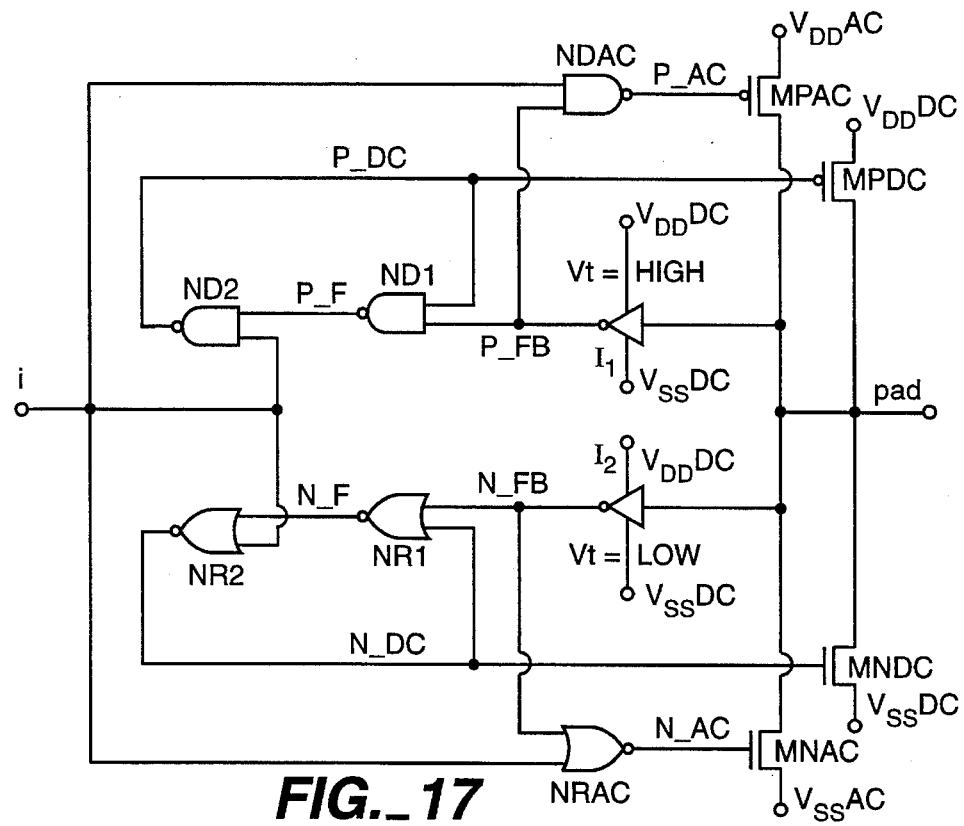
FIG._17
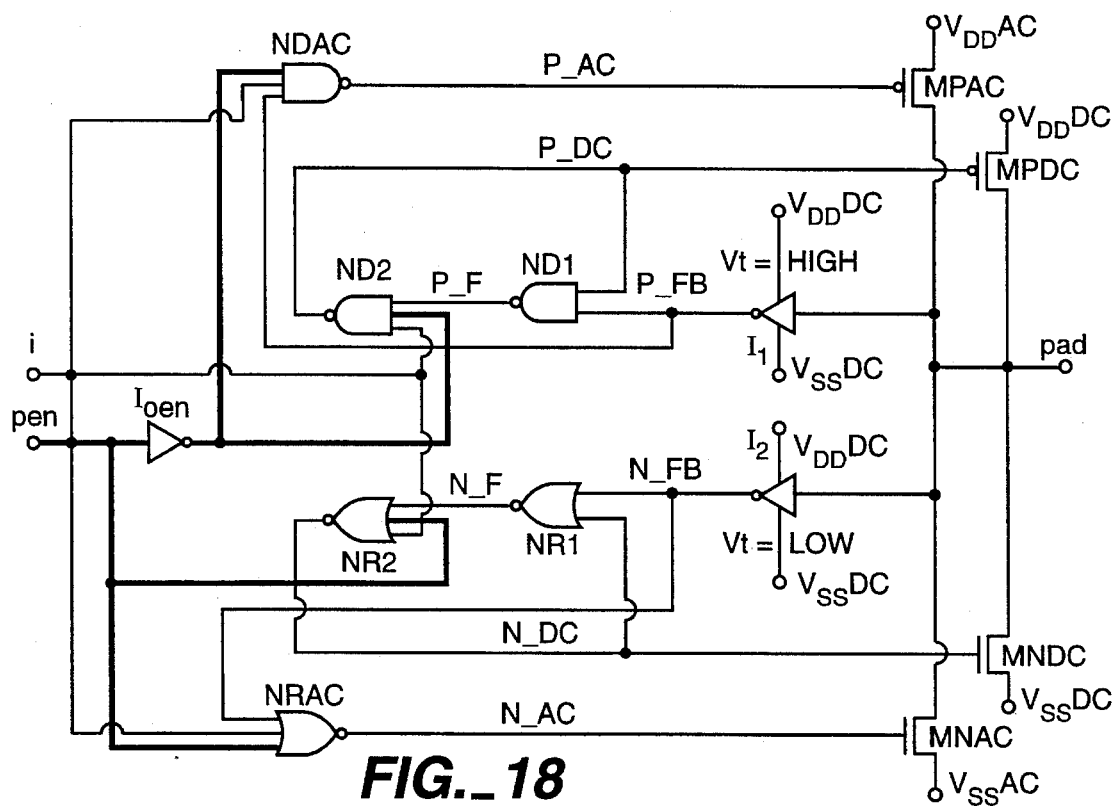
FIG._18

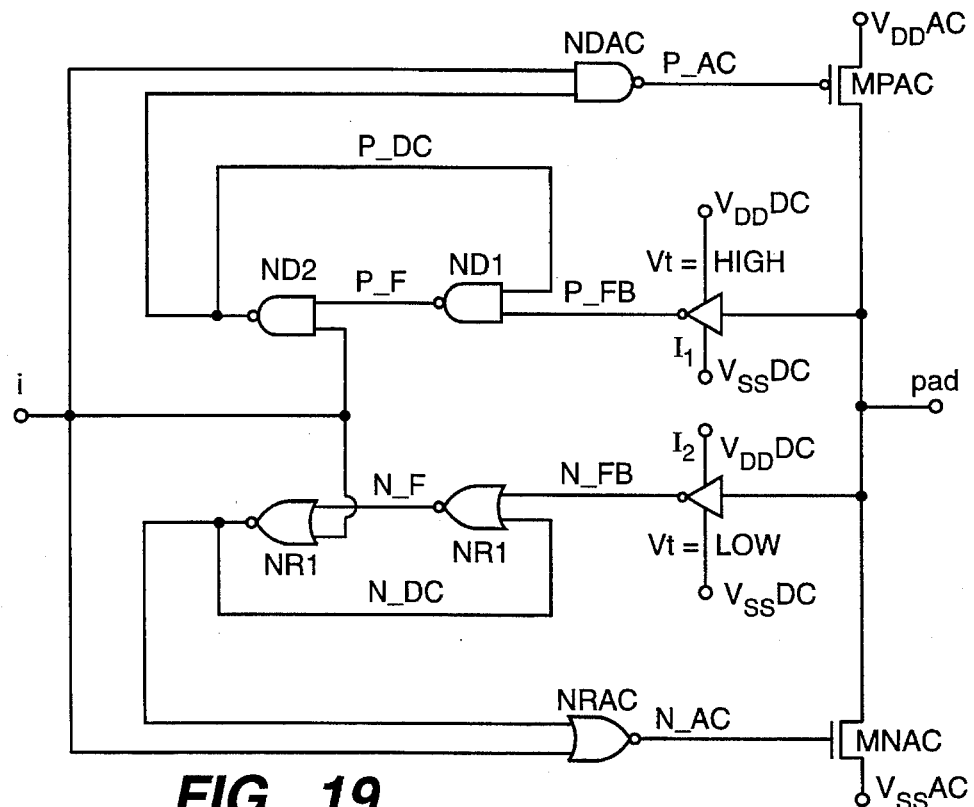
FIG._19
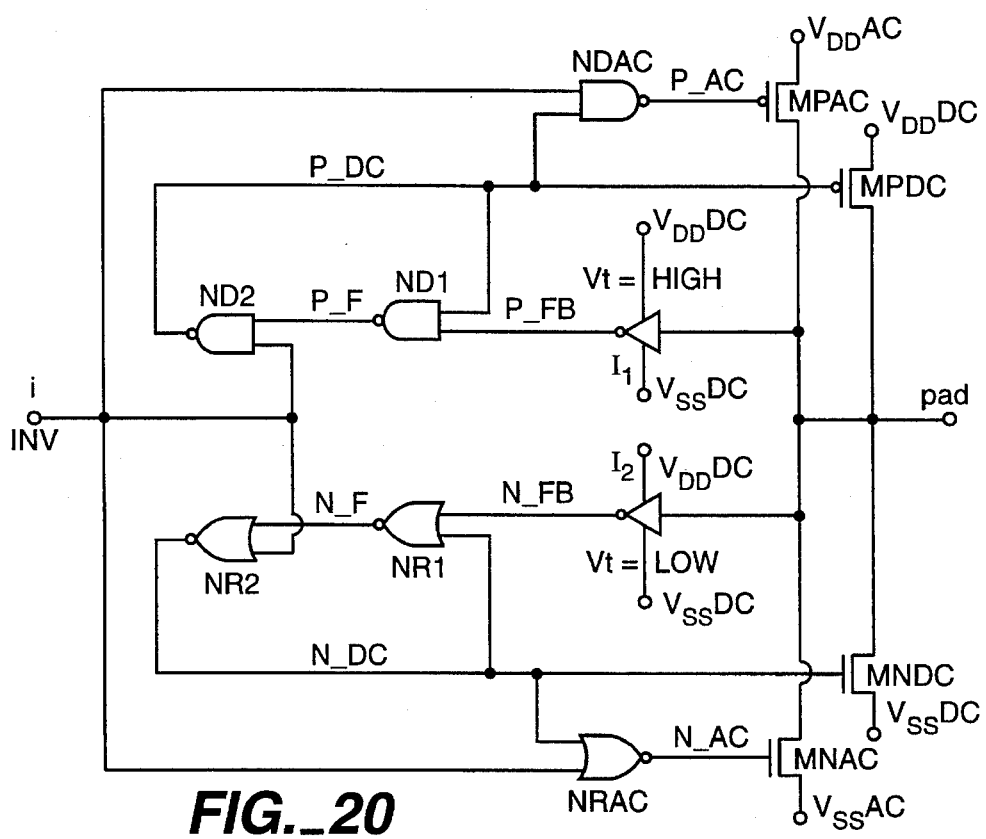
FIG._20

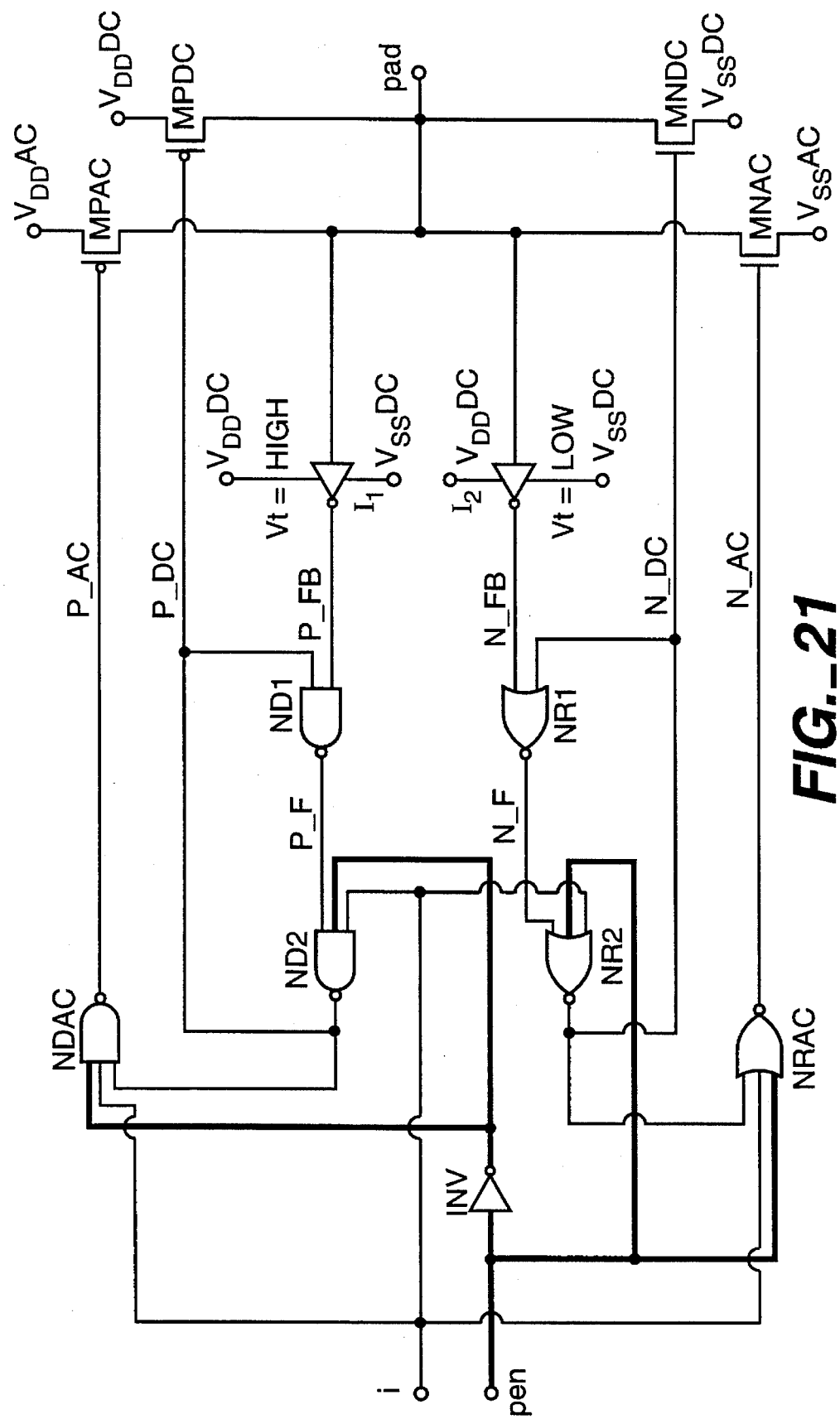
FIG._21

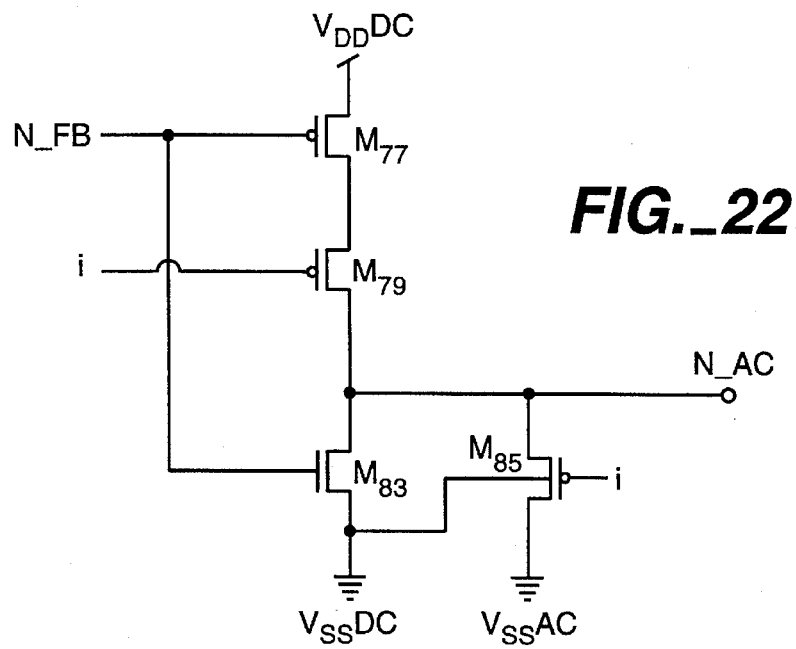
FIG._22
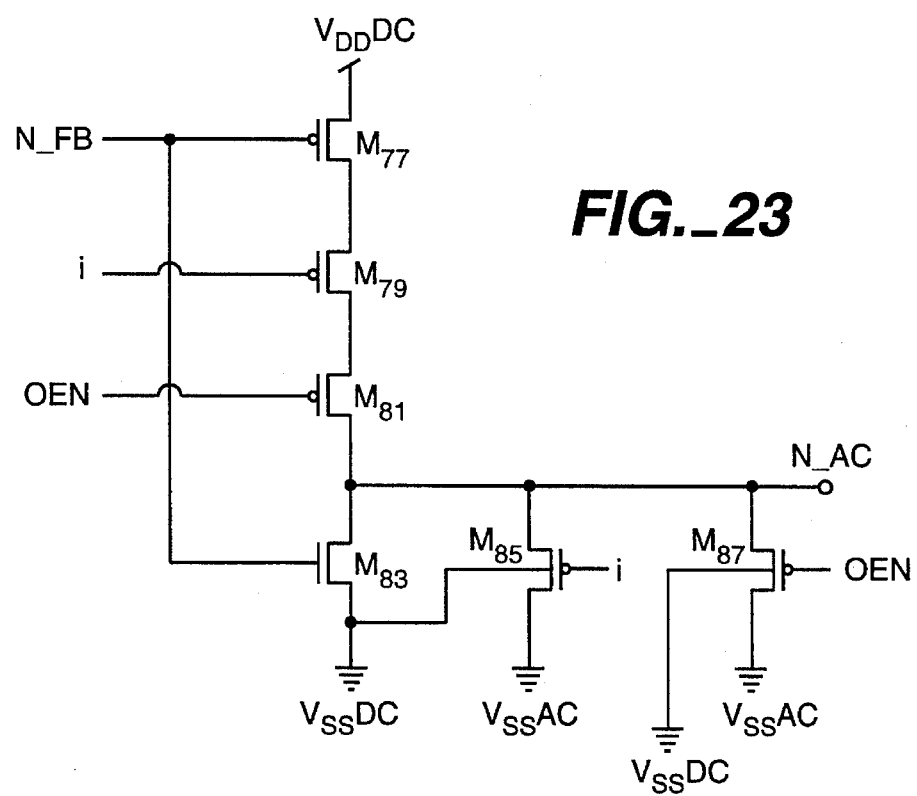
FIG._23

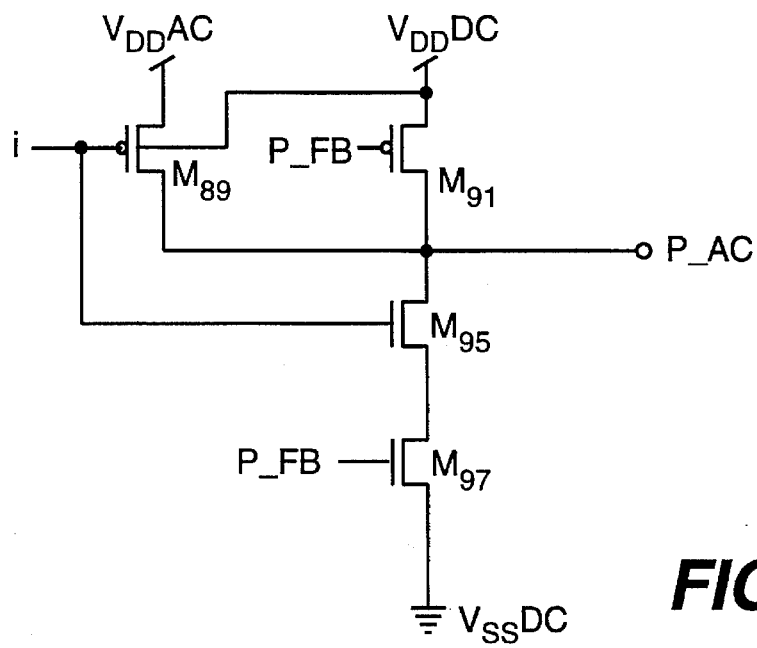
FIG._24
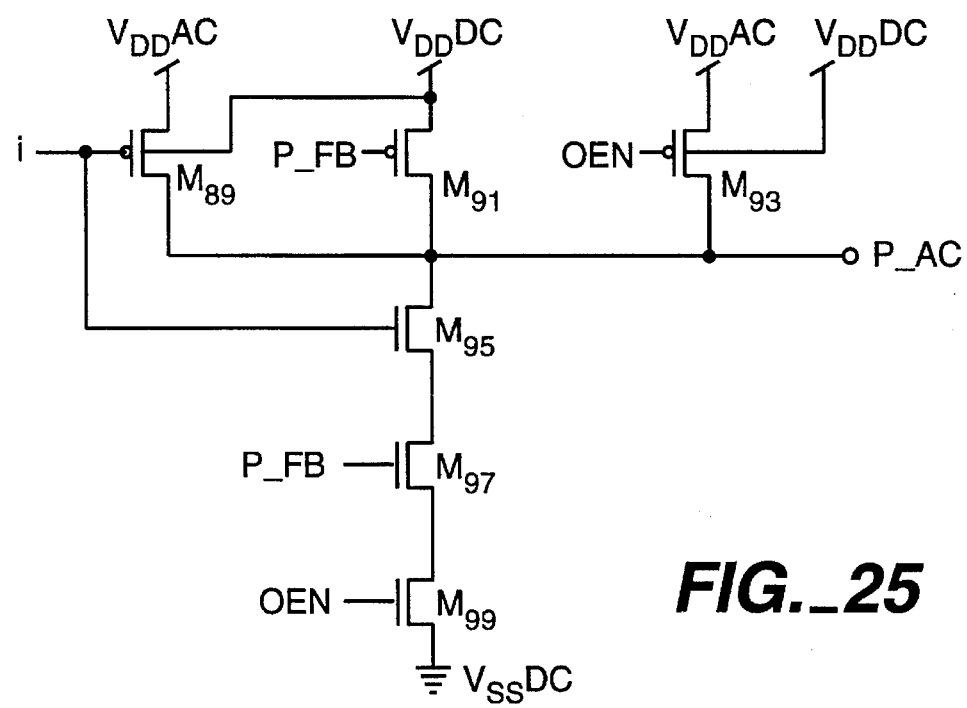
FIG._25

NOISE ISOLATED I/O BUFFER

RELATED APPLICATION

This is a continuation-in-part of U.S. application Ser. No. 08/052,442 entitled Noise Isolated I/O Buffer, filed Apr. 23, 1993 now U.S. Pat. No. 5,426,376.

BACKGROUND OF THE INVENTION

1. Field of the Invention The present invention relates to integrated circuit input/output (I/O) buffers, and more particularly to techniques for minimizing the effects of switching noise on such buffers.

2. State of the Art

The high speeds now possible with integrated circuits have made switching noise and power supply stability important considerations. Because of the high speeds of I/O buffers and the large loads they drive, noise from simultaneously switching output buffers (SSOs) has a large effect on power supply stability. Power and ground lines in an integrated circuit have associated with them distributed inductances that may be modeled as lumped inductors. During switching of an output buffer from low to high, current is sourced through a power lead and its associated inductance at a changing rate. Change in current through an inductor produces a voltage across the inductor. Accordingly, "voltage droop" occurs in which the supply voltage falls below the nominal supply voltage for a period of time before recovering. Similarly, during a high to low transition, "ground bounce" occurs in which the ground voltage rises above the nominal ground voltage for a period of time before recovering.

Voltage droop and ground bounce are both the result of voltage spikes on the power network caused by logic transitions. Such voltage spikes have two adverse consequences. Because they reduce the operating voltage, voltage spikes delay circuit operation. More importantly, voltage spikes may be transmitted through to the output of I/O buffers whose outputs are not being switched and should remain stable, therefore resulting in erroneous switching. The transmitted voltage spikes are therefore manifested as switching noise.

The foregoing problem becomes particularly acute in the case of a large number simultaneously switching I/O buffers. In FIG. 1, for example, the buffer 13 represents ten simultaneously switching I/O buffers undergoing a high to low transition. Also connected to the power network are other unswitched I/O buffers, represented by the unswitched I/O buffer 15 whose output is low and the unswitched I/O buffer 17 whose output is high. When the ten simultaneously switching I/O buffers switch from high to low, a large current flows through the ground lead with its associated inductance to ground, producing on the ground lead a large voltage spike. This voltage spike is transmitted through to the outputs of the unswitched I/O buffers and may cause erroneous transitions to be observed by the circuit connected to these I/O buffers. The I/O buffer 15 with its static low output is particularly affected by the described high-to-low transition, whereas the I/O buffer 17 with its static high output is particularly affected by a low-to-high transition.

One possible solution to the problem of switching noise is to reduce power and ground pin inductance, for example by adding additional power and ground pins to the power network. This measure, however, leaves fewer pins available as I/O pins. Another alternative is to use a more expensive package, an option that may not be economically feasible or attractive.

Other possible solutions to the problem of switching noise are designed to reduce the rate of change of current through the power and ground pin inductances. U.S. Pat. No. 4,825,102 describes an output driver in which switching of the driving devices is controlled such that one turns off before the other conducts current. This limits the "crowbar" current that flows from $V_{dd}$ to $V_{ss}$ during switching. U.S. Pat. No. 4,827,159 describes an output driver that uses inverters with different switching thresholds to control switching of the driving devices. U.S. Pat. No. 4,825,099 describes the use of feedback and RC delays to limit the rise and fall time of driver-controlling signals. In particular, feedback is used to control the current available to charge up the driver's gate. U.S. Pat. No. 4,928,199 discloses an output driver that provides for many smaller current surges at different times using simple control circuitry. U.S. Pat. No. 4,925,101 discloses an output driver that uses a source follower to provide an extra current source. None of these prior solutions, however, is entirely satisfactory.

SUMMARY OF THE INVENTION

An I/O buffer is provided that is noise-isolated, i.e., less susceptible to the effect of switching noise. In particular, a noise isolated I/O buffer includes an output terminal, a transient switching circuit connected to first power and ground voltage sources, to a logic input signal and to the output terminal, and a logic holding circuit connected to second power and ground voltage sources separate from the first power ground voltage sources, to the logic input signal and to the output terminal. The transient switching circuit causes a logic level of the output terminal to be switched responsive to a change in the input signal. The logic holding circuit causes the logic level of the output terminal to be maintained in the absence of a change in the input signal. In the absence of a change in the input signal, the transient switching circuit may be turned off, therefore presenting a high impedance to the first power and ground voltage sources. Switching noise in the first power supply network therefore is not transmitted through to the outputs of unswitched I/O buffers. The transient switching circuit and the logic holding circuit may be connected to the same power and ground voltage sources. The transient switching circuit, however, is turned off in the absence of a change in the input signal, and the logic holding circuit is turned off responsive to a change in the input signal. Smaller current surges are therefore provided at different times rather than a single large current surge, thereby reducing dI/dt. Provision is made for delaying turn on of the logic holding circuit until a logic transition of the output signal is substantially complete, further reducing the effects of switching noise on unswitched outputs. Preferably, the logic holding circuit, once it has been turned on, remains on despite possible changes in the output voltage level and is turned off only in response to changes in the input signal. The transient switching circuit may be constructed so as to, once it has been turned off, remain off despite possible changes in the output voltage level, or to turn back on in order to help return to output voltage to the proper level.

BRIEF DESCRIPTION OF THE DRAWINGS

The present invention may be further understood from the following written description in conjunction with the appended drawings. In the drawings:

FIG. 1 is a diagram illustrating a cause and effect of switching noise;

FIG. 2 is a corresponding diagram illustrating a cause of switching noise and a reduced effect of switching noise in accordance with the present invention;

FIG. 3 is a gate-level diagram of an I/O buffer circuit in accordance with the present invention;

FIG. 4 is a gate-level diagram of the AC driver portion of the I/O buffer circuit of FIG. 3;

FIG. 5 is a gate-level diagram of the DC driver portion of the I/O buffer circuit of FIG. 3;

FIG. 6 is a diagram illustrating the action of output drivers for both the AC and DC sections during a high to low transition;

FIG. 9 is a schematic diagram of another embodiment of the I/O buffer circuit of the present invention;

FIGS. 10A and 10B are waveform diagrams of operation of the circuit of FIG. 8;

FIG. 11 is a schematic diagram of another embodiment of the I/O buffer circuit of the present invention;

FIG. 12 is a schematic diagram of a further embodiment of the I/O buffer circuit of the present invention;

FIG. 13 is a waveform diagram illustrating the states of driver transistors during a falling output transition in accordance with further embodiments of the invention;

FIG. 14 is a gate-level diagram of a DC driver portion of an I/O buffer circuit in accordance with the further embodiments of the invention;

FIG. 15 is a gate-level diagram of an AC driver portion of an I/O buffer circuit in accordance with one further embodiment of the invention;

FIG. 16 is a waveform diagram illustrating operation of the AC driver of FIG. 15 during a rising output transition during which a transmission line is being driven;

FIG. 17 is a gate-level diagram of a complete I/O buffer circuit in accordance with one further embodiment of the invention, including the DC driver portion of FIG. 14 and the AC driver portion of FIG. 15;

FIG. 18 is a gate-level diagram of the I/O buffer circuit of FIG. 17, further including output enable circuitry;

FIG. 19 is a gate-level diagram of an AC driver portion of an I/O buffer circuit in accordance with another further embodiment of the invention;

FIG. 20 is a gate-level diagram of a complete I/O buffer circuit in accordance with another further embodiment of the invention, including the DC driver portion of FIG. 14 and the AC driver portion of FIG. 19;

FIG. 21 is a gate-level diagram of the I/O buffer circuit of FIG. 17, further including output enable circuitry;

FIG. 22 is a transistor-level diagram of a NOR gate used in the I/O buffer circuits of FIG. 17, FIG. 19 and FIG. 20;

FIG. 23 is a transistor-level diagram of a NOR gate used in the I/O buffer circuits of FIG. 18 and FIG. 21;

FIG. 24 is a transistor-level diagram of a NAND gate used in the I/O buffer circuits of FIG. 17, FIG. 19 and FIG. 20; and FIG. 25 is a transistor-level diagram of a NAND gate used in the I/O buffer circuits of FIG. 18 and FIG. 21.

DETAILED DESCRIPTION OF THE PREFERRED EMBODIMENTS

Figure 7:
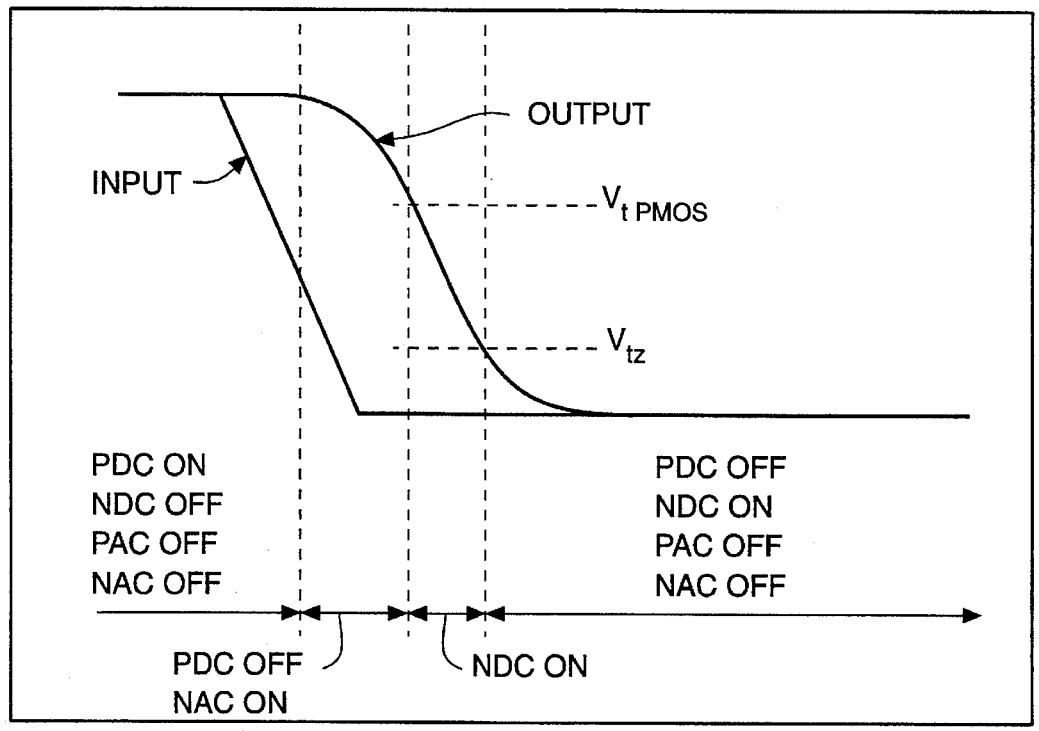
FIG. 7 is a waveform diagram illustrating the states of driver transistors during the falling output transition of FIG. 6.

Referring now to FIG. 2, noise isolation of I/O buffers is achieved by providing within each I/O buffer two separate drivers having separate power and ground networks, an AC driver, or Transient Switching Circuit (TSC), and a DC driver, or Logic Holding Circuit (LHC). The transient switching circuit and the logic holding circuit are connected in common to the input signal and the output terminal of each respective I/O buffer. The transient switching circuit is operative from a time just after the occurrence of a transition on the input signal of the I/O buffer to a time just prior to when the rail voltage is reached. The logic holding circuit is operative from a time just prior to when the transient switching circuit turns off to a time at which a subsequent logic transition occurs at the input signal. The operational phases of the transient switching circuit and the logic holding circuit are therefore largely non-overlapping.

Typically, the current sourced or sunk by the transient switching circuit is much greater (and changes at a greater rate) than the current sourced or sunk by the logic holding circuit. As a result, whereas a significant voltage spike is produced on the power lead or ground lead of the transient switching circuits, a comparatively small voltage spike is produced during switching on the power lead or ground lead connected to the logic holding circuits. The logic holding circuits' source of $V_{DD}$ (LHC $V_{DD}$) and the logic holding circuit ground (LHC ground) are therefore referred to as "quiet power" and "quiet ground", respectively, as compared to the transient switching circuit source of $V_{DD}$ (TSC $V_{DD}$) and the transient switching circuit ground (TSC ground).

A MOSFET is constructed by forming two separated wells of one conduction type in a substrate of another conduction type. One of the wells is connected to the source electrode of the device and the other of the wells is connected to the drain electrode. The region separating the two wells forms the channel. The gate electrode is formed above the channel on top of an insulating layer. The substrate of the one conduction type and the two wells of the opposite conduction type form two parasitic diodes from the substrate to the drain and source electrodes, respectively. The substrate is typically connected to power or ground so that a gate voltage referenced to power or ground may be applied to the gate electrode, forming a field in the channel region. Because of the parasitic diodes, power or ground noise may be transmitted to the drain or source electrode of the device. By connecting the substrates of all devices in both the transient switching circuit and the logic holding circuit of FIG. 2 to quiet ground, the I/O buffers are rendered less susceptible to switching noise of the noisy TSC ground. As seen in FIG. 2, although the outputs of the unswitched I/O buffers experience some switching noise upon the occurrence of falling and rising transitions at the output of the ten simultaneous I/O buffers, the noise is greatly reduced as compared to the voltage spike that is transmitted through to the outputs of the unswitched I/O buffers in FIG. 1.

Referring now to FIG. 3, the transient switching circuit of FIG. 2 may be regarded as an AC driver, and the logic holding circuit may be regarded as a DC driver, the AC and DC drivers (21,23) being connected as shown. An input signal is connected to both drivers, and both drivers are connected to a common output. That output is fed back to form a second input to both drivers. The different operational phases of the AC driver and the DC driver are controlled by the relative voltages of the input and output signals.

A simplified version of one possible embodiment of the AC driver 21 is shown in greater detail in FIG. 4. The driver includes driver transistors PAC and NAC and associated logic circuitry, including a NAND gate 25, a NOR gate 27 and two inverters 31 and 33. The input signal is connected to both the NAND gate 25 and the NOR gate 27. The output signal produced by the inverting buffer is input to the NAND gate 25 through one of the inverters (31) and to the NOR gate 27 through the other of the inverters (33). The threshold voltage $V_{t1}$ of the inverter 31 is set considerably higher than $V_{DD}/2$ and the threshold voltage $V_{t2}$ of the inverter 33 is set considerably lower than $V_{DD}/2$. As a result, in the case of a rising transition, as the output approaches $V_{DD}$ and passes through the threshold voltage $V_{t1}$, the AC driver 21 ceases to source current to the output. In the case of a failing transition, as the output approaches $V_{SS}$ and passes through the voltage $V_{t2}$, the AC driver 21 ceases to sink current. In both cases, as the transient response nears it conclusion, the AC driver 21 shuts off. Shutting off the AC driver at the appropriate time is important in order to minimize switching noise without incurring a speed penalty. If the AC driver were to not shut off, noise could be transmitted through the AC driver to its output. If the AC driver shuts off too soon, switching delay time is prolonged. If the AC driver shuts off too late, output ringing results.

The DC driver 23 is shown in greater detail in FIG. 5. Output driving transistors PDC and NDC produce the output signal and are controlled by logic that receives as inputs both the input signal and the output signal. The Transistor PDC is allowed to turn on only when the input signal and the output signal are both high, in which case both transistors M1 and M3 conduct, applying a low voltage to the gate of the transistor. Otherwise, the gate of transistor PDC is connected to a high voltage through transistor M4. The Transistor NDC is allowed to turn on only when the input signal and the output signal are both low, in which case transistors M5 and M7 both conduct, applying a high voltage to the gate of the transistor. Otherwise, the gate of transistor NAC is connected to a low voltage through transistor M8. During transient operation the DC driver 23 is therefore shut off. By turning the DC driver on only when the output voltage is near the rail voltage, the DC driver can be made sufficiently strong to pull the output voltage to the rail voltage quickly without producing an undesirable amount of noise.

The manner of interaction of the AC and the DC drivers may be seen in FIG. 6, showing the action of output drivers for both the AC and DC sections during a high to low transition. Initially, the output voltage is maintained high by the DC driver. When a transition occurs in the input signal, the DC driver turns off while the AC driver turns on and begins sinking current such that the output voltage beings to drop. As the output voltage drops, it reaches a voltage threshold defining a logic low, at which time the DC driver turns on. Because the low voltage feedback threshold $V_{t2}$ in the AC driver is lower than the DC feedback voltage threshold $V_{tPMOS}$, the AC driver continues to also sink current. For a period of time, the AC driver and the DC driver are therefore both on at the same time. As the output voltage continues to drop and reaches the low voltage feedback threshold $V_{t2}$, the AC driver turns off. The DC driver remains on in order to maintain the output voltage at a low logic level.

The same manner of operation for a falling output transition is represented in FIG. 7 in terms of the states of the driver transistors of the AC and DC drivers. As seen previously in FIGS. 4 and 5, the DC driver includes a p-type driver transistor, PDC, and an n-type driver transistor, NDC. Likewise, the AC driver includes a p-type transistor driver, PAC, and an n-type transistor driver, NAC. Initially, the input signal is at $V_{DD}$. At this time, the driver transistor PDC is on and the rest of the driver transistors are off. The input signal then undergoes a transition to $V_{SS}$. During the transition, the input signal reaches a logic low threshold level. At this time, the transistor M3 turns off and the transistor M4 turns on, such that the driver transistor PDC turns off. The NOR gate 27 of the AC driver receives a logic zero from the input signal and a logic zero from the inverted output signal, which is still high, therefore producing a logic high signal that turns the driver transistor NAC on. As a result, the output signal begins to transition, a with the transition of the output signal lagging the transition of the input signal. When the output signal reaches a logic zero voltage threshold, the control logic of the DC driver determines that the input and output signal are both low, and the driver transistor NDC turns on and remains on. The driver transistor NAC remains on until the output signal reaches the lower voltage threshold $V_{t2}$, at which time it turns off, leaving only the driver transistor NDC turned on.

Figure 8:
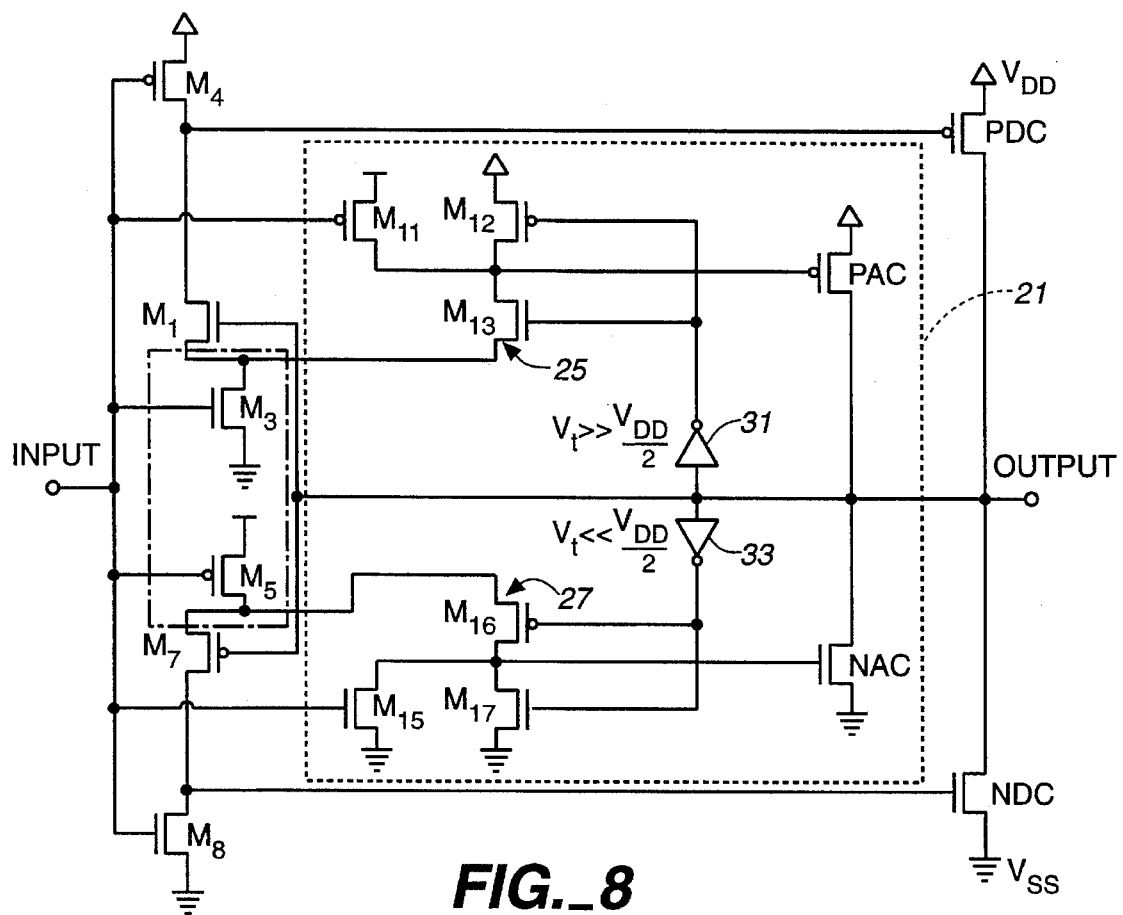
FIG. 8 is a schematic diagram of an embodiment of the I/O buffer circuit of the present invention.

Although the DC and AC sections are shown in FIGS. 3 and 4 as being separated, in a preferred embodiment, the DC and AC sections are not actually separated. Referring to FIG. 8, the portion of the circuit inside in the dashed box corresponds to the AC driver 21 and the portion of the circuit outside the dashed box corresponds to the DC driver 23. In the AC driver, transistors M11, M12, M13 and M3 correspond to the NAND gate 25 and transistors M15, M16, M17 and M5 correspond to the NOR gate 27. The transistor M3 and M5 are utilized in both the DC and AC sections.

As previously described in relation to FIG. 2, in order to achieve noise isolation, the present I/O buffer uses separate buses for AC power and DC power so as to minimize the voltage spikes seen at the output of a static circuit. Accordingly, in the noise isolated I/O buffer of FIG. 9, the DC driver transistor are connected to DC power and ground, respectively, and the AC driver transistors are connected to AC power and ground. The substrates of all of the transistors however, are connected to DC ground, i.e., "quiet" ground. The circuit of FIG. 9 also includes output enable circuitry so as to allow the I/O buffer to be connected to the same output terminal as one or more other I/O buffers. For each of the driver transistors (PDC, NDC, PAC, NAC), a disabling transistor (PDCoe, NDCoe, PACoe, NACoe) is connected to the gate electrode and controlled by the true or complement form of an output enable signal oen so as to place the driver transistors in the high impedance off state when the output enable signal (or tri-state signal) is active. In addition, two disabling transistors M3oe and M5oe are associated with transistor M3 and M5, respectively, to prevent the driver transistors from being activated through transistors M3 and M5.

Using bus separation as in FIG. 9, ground bounce transmitted through a "static" buffer is dramatically reduced as shown in FIGS. 10A and 10B. Sixteen simultaneously switching outputs having a load capacitance of 98 pF were switched from high to low. The circuit used three AC power pins and one DC power pin, each pin exhibiting an inductance of about 15 Nh. Results obtained using the noise-isolated I/O buffer of Figure are labelled "A", and comparable results obtained using a conventional buffer are labelled "B". As seen in FIG. 10A, the switched output waveform produced by the circuit of FIG. 9 exhibited substantially less ringing than a conventional I/O buffer with similar transient characteristics. This reduction in output ringing during switching is obtained because the output resistance $R_{out}$ of the I/O buffer is usually increased after switching when the AC section turns off. As seen in FIG. 10B, voltage spike transmitted to the output of a static circuit was greatly reduced using the circuit of FIG. 9 as compared to a conventional design. For a conventional design, ground bounce causes the output of the static circuit to ring, the transmitted voltage spike having an initial magnitude of about 3 volts and gradually dying out thereafter. Using the circuit of FIG. 9, the transmitted voltage spike does not exceed one volt, avoiding the erroneous logic transitions that would otherwise be caused using the conventional design.

Although for quietest operation the provision of separate AC and DC power and ground networks (power bus separation) as shown in FIG. 9 is preferred, the circuit of FIG. 8 may still be employed to advantage without bus separation. The use of separate AC and DC sections (without bus separation) is still effective to reduce Di/dt by providing for smaller current surges at different times as compared to a single large current surge in the case of conventional I/O drivers.

Referring to FIG. 11, in another embodiment of the noise-isolated I/O buffer of the present invention, an AC driver section includes transistors T15 and T39 (counterparts of PAC and NAC in the circuit of FIG. 9), transistors T10, T1, T27 and T28, and a transmission gate tgate3. A DC driver section includes transistors T20 and T39 (counterparts of PDC and NDC), transistors T9, T40, T26 and T41, and a transmission gate tgate2. Common to both the AC and DC sections are the combination 52 of a schmitt-trigger inverter and an EXCLUSIVE-NOR gate, and an inverter inv3. The AC and DC sections are of substantially the same configuration. Enable circuitry is provided including transistors T14, T29 and T2, an inverter inv4, and transmission gates tgate 1 and tgate 4.

The circuit is enabled when the input EN is logic 0, in which case transmission gates tgate 1 and tgate4 are on and transistors T14 and T29 are off.

The XNOR-schmitt combination 52 receives as inputs both the input signal and the output signal and determines whether they are the same (indicating static operation) or different (indicating a transition situation). If the input and output signals are the same, the XNOR-schmitt combination outputs a logic 1, turning transmission gate tgate3 (and hence the AC section) off, and turning transmission gate tgate2 (and hence the DC section) on. Depending on the input signal, either transistor T9 or transistor T26 will be turned on and the other will be turned off, turning one of the corresponding driver transistors T20 and T39 off and the other on.

When the input signal changes such that the input and output signals are no longer the same, transistors T40 and T41 turn on, disabling the DC section. Transmission gate tgate2 (DC section) is turned off, and transmission gate tgate3 (AC section) is turned on. Depending on the input signal, either transistor T10 or transistor T27 will be turned on and the other will be turned off, turning one of the corresponding driver transistors T15 and T39 off and the other on. When switching is done, transistors T1 and T28 disable the AC section, and the circuit enters static operation in the opposite state as before.

Another embodiment of the noise-isolated buffer of the present invention is shown in FIG. 12. Transistors U1 through U6 make up the AC driver (the transient switching circuit). Transistors U7 through U14 make up the DC driver (the logic holding circuit). Of the foregoing, transistors U2 and U5 connect to the AC power supply.

All other power connections, including substrates of U2 and U5, are to the DC power supply.

Transistors U3 and U4 feed back the pad voltage to the AC driver so that it shuts off as the pad voltage approaches the level it is switching to.

Transistors U10 and U11 are optional but may be used to prevent the DC section from turning on until the output voltage has begun to change. The goal of having the DC driver turn on slowly or after the output has almost reached the desired voltage can also be accomplished by making U9 and U12 the appropriate sizes. The higher the resistance of U9 and U12 the slower the DC driver turns on and the less noise it generates, although at the expense of slowing the pad down somewhat.

As compared with the circuit of FIG. 9, the DC driver in the circuit of FIG. 12 must be turned on sooner, because the AC driver begins to turn itself off very quickly, as soon as the output starts to change. The DC driver has to finish switching the output. In the preferred circuit the AC driver can switch the output all by itself. In the circuit of FIG. 12, on the other hand, the AC driver may require some help to finish switching the output unless the load is very small, because it will shut itself off. Turning the DC driver on earlier generates more noise than in the preferred circuit of FIG. 9. The circuit of FIG. 12 has the advantage that it does not oscillate after it switches if the DC driver is made relatively small.

In the I/O buffer circuits described to this point, the DC driver turns on well before the output signal has finished transitioning and the AC driver has turned off, as illustrated in FIG. 7. Although such a buffer circuit may be used in either shared power bus or separated power bus arrangements, it is most advantageous in shared power bus arrangements in which 1) the DC driver will inevitably experience some effect from noise produced by the AC driver; and 2) the DC driver may be used to help accomplish the output transition.

In separated power bus arrangements, in order to achieve the greatest immunity to switching noise, the DC driver should not be turned on until the output transition is substantially complete and the AC driver has been or is about to be turned off. This situation is illustrated in FIG. 13. As compared to FIG. 7, in which there is a substantial period of time during which both the DC driver and the AC driver are on, in FIG. 13, the DC driver is named on at about the same time as the AC driver is turned off. In actual practice, in the further embodiments of the invention to be presently described, the I/O buffer circuit is designed to guarantee some minimal period of overlap during which both the DC driver and the AC driver are both on. By delaying turning on the DC driver until the output transition is substantially complete, the DC driver experiences noise from the AC driver to only a minimal extent. This feature becomes especially important when driving large capacitive loads which may require the AC driver to remain on for a prolonged period of time.

The effects of switching noise on the DC driver may be further minimized by making operation of the DC driver independent of output voltage once the DC driver has been activated. This measure prevents the possible occurrence of an oscillating behavior in which output ringing causes the driver to repeatedly switch on and off, generating considerable switching noise. Holding the DC driver on also mitigates undesired variation in the output signal; i.e., the DC driver, insofar as it is able, keeps the output signal at its prescribed level.

A DC driver which is independent of output voltage once the DC driver has been activated is shown in FIG. 14. A p-channel MOSFET MPDC is connected between VDDDC and the output pad, and an n-channel MOSFET MNDC is connected between the output pad and VSSDC. The output pad voltage is monitored by a pair of inverters, I1 and I2. The inverter I1 is sized so as to exhibit a high threshold voltage, and the inverter I2 is sized so as to exhibit a low threshold voltage. Note that the inverters I1 and I2 are both connected to quiet power and quiet ground, VDDDC and VSSDC.

The inverter I1 produces a feedback signal P—FB used to control the MOSFET MPDC. The signal P—FB is input to a first NAND gate ND1, which produces a signal P—F. The latter signal is input to a second NAND gate ND2, which receives as its other input signal the input signal i to the buffer circuit. The NAND gate ND2 produces an output signal P—DC, which is connected to the gate of the MOSFET MPDDC. The output signal P—DC is also input to the NAND gate ND 1 to produce the signal P—F.

In similar fashion, the inverter I2 produces a feedback signal N—FB used to control the MOSFET MNDC. The signal N—FB is input to a first NOR gate NR1, which produces a signal N—F. The latter signal is input to a second NOR gate NR2, which receives as its other input signal the input signal i to the buffer circuit. The NOR gate NR2 produces an output signal N—DC, which is connected to the gate of the MOSFET MNDC. The output signal N—DC is also input to the NOR gate NR1 to produce the signal N—F.

Assume initially that the input signal i to the buffer is high, the signal P—DC is low and the MOSFET MPDC is turned on, maintaining the output pad at a logic high level. The MOSFET MNDC is turned off. If output ringing or contention should cause the output pad voltage to dip below the threshold voltage of the inverter I1, the signal P—FB changes but the signals P—F and P—DC remain unaffected, the NAND gates ND 1 and ND2 effectively forming a latch that latches the previously existing value of P—DC. The MOSFET MPDC therefore remains on.

Should the input signal i to the buffer change from a logic high to a logic low, however, the signal P—DC becomes a logic high, turning off the MOSFET MPDC. The MOSFET MNDC also remains off until such time as the output pad voltage reaches the low voltage threshold of the inverter I2. At that time, the signal N—FB becomes a logic high, the signal N—F become a logic low, and the signal N—DC becomes a logic high, turning on the MOSFET MNDC. The buffer then remains latched in this condition until a subsequent change in the input signal i.

By making operation of the DC driver independent of output voltage once the DC driver has been activated, the effects of switching noise on the DC driver is minimized by preventing the possible occurrence of an oscillating behavior in which output ringing causes the driver to repeatedly switch on and off. Holding the DC driver on also mitigates undesired variation in the output signal by, insofar as the DC driver is able, keeping the output signal at its prescribed level.

As for the AC driver, whereas in some circumstances it may be advantageous for the AC driver to exhibit a latching behavior in the same manner as the DC driver, in other circumstances, it may be desirable to have the AC driver switch on and off with changes in the output signal. Particularly in the case of a CMOS driver, in which the DC section is small compared to the AC section, the DC driver by itself may be unable to maintain the level of the output signal and will require that the AC driver be switched back on in response to variations in the output signal. In the case of a TTL driver, in which the DC driver is typically equally as strong as the AC driver, switching back on the AC driver will usually be unnecessary and would unnecessarily contribute to additional switching noise. More generally, the differences in driving performance between a latching and a non-latching AC driver can be categorized according to driver device sizes as follows.

$$\text{Case 1:} \quad \left(\frac{W}{L}\right)_{MXDC} < \left(\frac{W}{L}\right)_{MXAC}$$

$$\text{Case 2:} \quad \left(\frac{W}{L}\right)_{MXDC} \geq \left(\frac{W}{L}\right)_{MXAC}$$

In Case 1, the output resistance of the buffer circuit may increase dramatically during switching, especially if the buffer circuit is driving a transmission-line type of load. As a result, the output voltage will have an increased degree of freedom and may transit in the opposite direction due to transmission-line effects.

Referring to FIG. 15, an AC driver suited for the foregoing situation incorporates sensing feedback to the AC section so that the AC section's larger devices will turn on if the output voltage strays away from the intended signal level. A p-channel MOSFET MPAC is connected between VDDAC and the output pad, and an n-channel MOSFET MNAC is connected between the output pad and VSSAC. The output pad voltage is monitored by a pair of inverters, I1 and I2. The inverter I1 is sized so as to exhibit a high threshold voltage, and the inverter I2 is sized so as to exhibit a low threshold voltage. Note that the inverters I1 and I2 are both connected to quiet power and quiet ground, VDDDC and VSSDC.

The inverter I1 produces a feedback signal P—FB used to control the MOSFET MPAC. The signal P—FB is input to a NAND gate NDAC, which receives as its other input signal the input signal i to the buffer circuit. The NAND gate NDAC produces an output signal P—AC, which is connected to the gate of the MOSFET MPAC.

In similar fashion, the inverter I2 produces a feedback signal N—FB used to control the MOSFET MNAC. The signal N—FB is input to a NOR gate NRAC, which receives as its other input signal the input signal i to the buffer circuit. The NOR gate NRAC produces an output signal N—AC, which is connected to the gate of the MOSFET MNAC.

FIG. 16 illustrates a possible response of the AC driver circuit of FIG. 15 to a rising-edge input signal. Initially, both the input signal i and the output signal at the pad are assumed to be logic low. Both the MOSFETS MPAC and MNAC are turned off. When the input signal i becomes logic high, the NAND gate NDAC responds by changing the signal P—AC from high to low, turning on the MOSFET MPAC. The output signal at the pad will therefore begin to rise. When the output signal has substantially completed its transition from low to high, the DC driver (FIG. 14) will turn on. When the output signal reaches the threshold voltage Vt=HIGH of the inverter I1, the AC driver will turn off.

Because of transmission-line effects, however, the output voltage may then fall. If the output voltage should fall below the threshold voltage Vt=HIGH, the AC driver will then turn back on in order to drive the output voltage higher. The output signal may experience several oscillations, with the AC driver turning off and on, before the output signal is finally stabilized at the correct level.

The complete buffer circuit, incorporating both the DC driver of FIG. 14 and the AC driver of FIG. 15, is shown in FIG. 17.

Referring to FIG. 18, output enable capability may be added to the buffer circuit of FIG. 17 using minimal additional logic. Three-input gates, rather than two-input gates, are used for the gates NDAC, ND2, NR2 and NRAC. An additional output enable signal oen is input directly to the gates NR2 and NRAC. When the output enable signal is high, the signals N—DC and N—AC are thereby forced low, preventing the MOSFETS MNDC and MNAC from turning on. An additional inverter Ioen inverts the output enable signal. The inverted output enable signal is input to the gates ND2 and NDAC. When the output enable signal is high, the inverted output enable signal is low, thereby forcing the signals P—DC and P—AC high and preventing the MOSFETS MPDC and MPAC from turning on.

In Case 2 above, the output resistance of the buffer circuit remains unchanged or is reduced during switching. As a result, the output voltage of the buffer will not change to a great extent, so the AC section can remain off after switching. This result may be accomplished using identical latching circuits as in the DC driver of FIG. 14.

Referring more particularly to FIG. 19, showing a latching AC driver circuit, a p-channel MOSFET MPAC is connected between VDDAC and the output pad, and an n-channel MOSFET MNAC is connected between the output pad and VSSAC. The output pad voltage is monitored by a pair of inverters, I1 and I2. The inverter I1 is sized so as to exhibit a high threshold voltage, and the inverter I2 is sized so as to exhibit a low threshold voltage. Note that the inverters I1 and I2 are both connected to quiet power and quiet ground, VDDDC and VSSDC.

The inverter I1 produces a feedback signal P—FB used to control the MOSFET MPDC. The signal P—FB is input to a first NAND gate ND 1, which produces a signal P—F. The latter signal is input to a second NAND gate ND2, which receives as its other input signal the input signal i to the buffer circuit. The NAND gate ND2 produces an output signal P—DC, which is input to a NAND gate NDAC, which also receives as its other input signal the input signal i to the buffer circuit. The NAND gate NDAC produces an output signal P—AC, which is connected to the gate of the MOSFET MPAC. The output signal P—DC of the NAND GATE ND2 is also input to the NAND gate ND 1 to produce the signal P—F.

In similar fashion, the inverter I2 produces a feedback signal N—FB used to control the MOSFET MNDC. The signal N—FB is input to a first NOR gate NR1, which produces a signal N—F. The latter signal is input to a second NOR gate NR2, which receives as its other input signal the input signal i to the buffer circuit. The NOR gate NR2 produces an output signal N—DC, which is input to a NOR gate NRAC, which also receives as its other input signal the input signal i to the buffer circuit. The NOR gate NRAC produces an output signal N—AC, which is connected to the gate of the MOSFET MNAC. The output signal N—DC of the NOR gate NR2 is also input to the NOR gate NR1 to produce to signal N—F.

Assume initially that the input signal i to the buffer is high, the signal P—DC is low and the MOSFET MPDC is turned off, and that the output pad has already been driven to a logic high level. Assume also that the signal N—DC is high and that MOSFET MNDC is turned off. If output ringing or contention should cause the output pad voltage to dip below the threshold voltage of the inverter I1, the signal P—FB changes but the signals P—F and P—DC remain unaffected, the NAND gates ND1 and ND2 effectively forming a latch that latches the previously existing value of P—DC. The MOSFET MPAC therefore remains off.

Should the input signal i to the buffer change from a logic high to a logic low, however, the signal N—AC becomes a logic high, turning on the MOSFET MNAC. The MOSFET MPAC remains off. The buffer then remains latched in this condition until a subsequent change in the input signal i.

Because the latching circuits of the DC and AC drivers are the same, they may be shared between the two drivers. The complete buffer circuit, incorporating both the DC driver of FIG. 14 and the AC driver of FIG. 19, is shown in FIG. 20. Output enable capability may be added to the buffer circuit of FIG. 20 using minimal additional logic, as shown in FIG. 21.

The NAND gates and NOR gates used in the I/O buffer circuits of FIG. 17 through FIG. 21 to drive the transient switching circuit are of a modified construction designed so as to prevent possible spurious output transitions. In particular, the NAND gates and NOR gates used in the I/O buffer circuits of FIG. 17 through FIG. 21 to drive the transient switching circuit are separately referenced to both noisy power or ground and quiet power or ground.

Referring to FIG. 22, showing in greater detail the NOR gate NRAC of FIG. 17, FIG. 19 and FIG. 20, if the input signal i and the feedback signal N—FB are both low, the output N—AC of the NOR gate NRAC is pulled high through transistors M77 and M79. If either the input signal i or the feedback signal N—FB, or both, is high, then the output N—AC of the NOR gate NRAC is pulled low through one or both of transistors M83 and M85.

The source of transistor M83 is connected to VSSDC, while the source of transistor M85 is connected to VSSAC. Furthermore, the substrate of transistor M85 is connected to VSSDC. The effect of this arrangement is that the output N—AC of the NOR gate is pulled low to a value near the average value of VSSDC and VSSAC. This feature is important in avoiding spurious transitions.

Recall that the driver transistor NAC is connected between the output pad and VSSAC and is controlled by the output N—AC of the NOR gate NRAC. The voltage VSSAC (noisy ground) may spike positively or negatively. Assume that the output N—AC is low, turning the driver transistor NAC off. If VSSAC spikes negatively, then if the output N—AC were driven to VSSDC which remained at a constant voltage level, the voltage $V_{gs}$ of the driver transistor NAC would then increase with the possibility of turning the driver transistor NAC on. On the other hand, if VSSAC spikes positively, then if the output N—AC were driven to VSSAC, then the driver transistor would in effect be connected in a diode configuration ($V_{gs}$=0), with the result that the output pad would be driven to within a diode drop of VSSAC.

In order to account for both of the foregoing situations, the output N—AC is referenced through two separate paths to both VSSDC and VSSAC. When the input signal i and the feedback signal N—FB are both high, the output signal N—AC is driven to a value near the average value of VSSDC and VSSAC. If VSSAC spikes negatively, the output signal N—AC follows to a sufficient degree to prevent the driver transistor NAC from being erroneously turned on. If VSSAC spikes positively, since the output signal N—AC is not referenced solely to VSSAC and $V_{gs}$≠0, the driver transistor NAC is not diode-connected and is therefore not driven to within a diode drop of VSSAC.

The output enable version of the NOR gate of FIG. 22 is shown in FIG. 23. The output enable version of the NOR gate is used in the I/O buffer circuits of FIG. 18 and FIG. 21.

Referring to FIG. 24, showing in greater detail the NAND gate NDAC of FIG. 17, FIG. 19 and FIG. 20, if the input signal i and the feedback signal P—FB are both high, the output P—AC of the NAND gate NDAC is pulled low through transistors M95 and M97. If either the input signal i or the feedback signal P—FB, or both, is low, then the output P—AC of the NAND gate NDAC is pulled high through one or both of transistors M89 and M91.

The source of transistor M91 is connected to VDDDC, while the source of transistor M89 is connected to VDDAC. Furthermore, the substrate of transistor M89 is connected to VDDDC. The effect of this arrangement is that the output P—AC of the NAND gate is pulled high to a value near the average value of VDDDC and VDDAC. As in the case of the NOR gate NRAC, this feature is important in avoiding spurious transitions.

The driver transistor PAC is connected between the output pad and VDDAC and is controlled by the output P—AC of the NAND gate NDAC. The voltage VDDAC (noisy power) may spike positively or negatively. Assume that the output P—AC is high, turning the driver transistor PAC off. If VDDAC spikes negatively, then if the output P—AC were driven to VDDDC which remained at a constant voltage level, the voltage $V_{gs}$ of the driver transistor PAC would then increase with the possibility of turning the driver transistor PAC on. On the other hand, if VDDAC spikes positively, then if the output P—AC were driven to VDDAC, then the driver transistor would in effect be connected in a diode configuration ($V_{gs}=0$), with the result that the output pad would be driven to within a diode drop of VDDAC.

In order to account for both of the foregoing situations, the output P—AC is referenced through two separate paths to both VDDDC and VDDAC. When the input signal i and the feedback signal P—FB are both low, the output signal N—AC is driven to a value near the average value of VDDDC and VDDAC. If VDDAC spikes negatively, the output signal P—AC follows to a sufficient degree to prevent the driver transistor NAC from being erroneously turned on. If VDDAC spikes positively, since the output signal P—AC is not referenced solely to VDDAC and $V_{gs}\neq 0$, the driver transistor NAC is not diode-connected and is therefore not driven to within a diode drop of VDDAC.

The output enable version of the NAND gate of FIG. 24 is shown in FIG. 25. The output enable version of the NAND gate is used in the I/O buffer circuits of FIG. 18 and FIG. 21.

The foregoing has described the principles, preferred embodiments and modes of operation of the present invention. However, the invention should not be construed as limited to the particular embodiments discussed. Instead, the above described embodiments should be regarded as illustrative rather than restrictive and it should be appreciated that variations may be made in the embodiments by workers skilled in the art without departing from the scope of the present invention as defined by the following claims.

What is claimed is:

1. A noise-isolated I/O buffer, comprising:

an output terminal;

feedback means, including a first logic gate and connected to a logic input signal and to said output terminal, for producing a first pair of output signals and a second pair of output signals;

transient switching circuit means connected to first power and ground voltage sources and responsive to said first pair of output signals for causing a logic level of said output terminal to be switched responsive to a change in said input signal, and for turning off in the absence of a change in said input signal; and logic holding circuit means connected to second power and ground voltage sources separate from said first power and ground voltage sources and responsive to said second pair of output signals for causing the logic level of the output terminal to be maintained in the absence of a change in said input signal and for turning off responsive to a change in the input signal;

wherein said first logic gate is referenced to both one of said first power and ground voltage sources and to one of said second power and ground voltage sources.

2. The apparatus of claim 1, wherein said transient switching circuit means comprises first and second transistors having drains connected in common to said output terminal, one of said first and second transistors having a source connected to said first power voltage source and another of said first and second transistors having a source connected to said first ground voltage source.

3. The apparatus of claim 2, wherein said feedback means comprises a first inverter having a first voltage threshold connected to said output terminal and producing a first feedback signal and a second inverter having a second voltage threshold connected to said output terminal and producing a second feedback signal.

4. The apparatus of claim 3, wherein said first logic gate is connected to said first feedback signal and to said logic input signal and produces one of said first pair of output signals, said one of said first pair of output signals being connected to a gate of said first transistor.

5. The apparatus of claim 4, wherein said feedback means comprises a second logic gate connected to said second feedback signal and to said logic input signal and producing another of said first pair of output signals, said another of said first pair of output signals being connected to a gate of said second transistor.

6. The apparatus of claim 5, wherein said first logic gate and said second logic gate are of different logic types.

7. The apparatus of claim 6, wherein each of said first and second logic gates comprises first and second transistors having drains connected in common to an output terminal of said logic gate, one of said first and second transistors having a source connected to one of said first power voltage source and said first ground voltage source and another of said first and second transistors having a source connected to a corresponding one of said second power voltage source and said second ground voltage source.

8. The apparatus of claim 7, wherein within each of said first and second logic gates a substrate of one of said first and second transistors is connected to the source of another of said first and second transistors.

\* \* \* \* \*